United States Patent
Wu et al.

(10) Patent No.: US 12,506,123 B2
(45) Date of Patent: Dec. 23, 2025

(54) SEMICONDUCTOR DEVICE

(71) Applicant: ROHM CO., LTD., Kyoto (JP)

(72) Inventors: Xiaopeng Wu, Kyoto (JP); Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 549 days.

(21) Appl. No.: 17/609,739

(22) PCT Filed: May 18, 2020

(86) PCT No.: PCT/JP2020/019610
§ 371 (c)(1),
(2) Date: Nov. 8, 2021

(87) PCT Pub. No.: WO2020/241346
PCT Pub. Date: Dec. 3, 2020

(65) Prior Publication Data
US 2022/0181310 A1    Jun. 9, 2022

(30) Foreign Application Priority Data

May 24, 2019    (JP) .................................. 2019-097682

(51) Int. Cl.
*H01L 25/10* (2006.01)
*H01L 23/00* (2006.01)
*H01L 23/31* (2006.01)

(52) U.S. Cl.
CPC ........ *H01L 25/105* (2013.01); *H01L 23/3114* (2013.01); *H01L 24/32* (2013.01);
(Continued)

(58) Field of Classification Search
CPC . H01L 2224/29144; H01L 2224/29147; H01L 2224/29155; H01L 2224/29163;
(Continued)

(56) References Cited

U.S. PATENT DOCUMENTS

| 4,645,116 A * | 2/1987 | Henein ................... H01L 24/29 228/123.1 |
| 2004/0161002 A1* | 8/2004 | Kohara ............... H01S 5/02325 372/34 |

(Continued)

FOREIGN PATENT DOCUMENTS

| DE | 102021109761 A1 * | 11/2021 | ............. H01L 24/48 |
| JP | 2009-158787 | 7/2009 | |

(Continued)

OTHER PUBLICATIONS

Office Action received in the corresponding Japanese Patent application, Sep. 5, 2023, and machine translation (12 pages).
International Search Report issued in PCT/JP2020/019610, Aug. 18, 2020 (3 pages).
Office Action issued in corresponding Chinese Patent application No. 202080037873.3, Feb. 26, 2025, and machine translation (18 pages).

(Continued)

*Primary Examiner* — Teresa M. Arroyo
(74) *Attorney, Agent, or Firm* — HSML P.C.

(57) ABSTRACT

A semiconductor device includes a conductive member having an obverse face, a semiconductor element mounted on the obverse face, and a conductive bonding material disposed between the conductive member and the semiconductor element, to conductively bond the conductive member and the semiconductor element together. The conductive bonding material includes a metal base layer, a first bonding layer, and a second bonding layer. The first bonding layer is disposed between the metal base layer and the semiconductor element, and bonded to the semiconductor element by metal solid-phase diffusion. The second bonding layer is disposed between the metal base layer and the conductive member, and bonded to the conductive member by metal solid-phase diffusion.

20 Claims, 18 Drawing Sheets

(52) U.S. Cl.
CPC .............. *H01L 24/48* (2013.01); *H01L 24/73* (2013.01); *H01L 2224/32225* (2013.01); *H01L 2224/48227* (2013.01); *H01L 2224/73265* (2013.01); *H01L 2924/13055* (2013.01); *H01L 2924/13091* (2013.01)

(58) Field of Classification Search
CPC . H01L 2224/29166; H01L 2224/32013; H01L 2224/45124; H01L 2224/45144; H01L 2224/45147; H01L 2224/83439; H01L 2224/8383; H01L 2224/32225; H01L 2224/0603; H01L 2224/48137; H01L 2224/48465; H01L 2224/48471; H01L 2224/49111; H01L 2224/28; H01L 2224/83894; H01L 2224/48227; H01L 2224/73265; H01L 2224/04026; H01L 2224/04042; H01L 2224/05639; H01L 2224/06181; H01L 2224/29118; H01L 2224/29124; H01L 2224/29138; H01L 2224/85439; H01L 2924/15192; H01L 2924/181; H01L 2924/19105; H01L 2924/13055; H01L 2924/13091; H01L 23/3107; H01L 23/13; H01L 23/3114; H01L 23/3121; H01L 23/3735; H01L 23/49811; H01L 23/5386; H01L 25/072; H01L 25/105; H01L 25/18; H01L 24/05; H01L 24/06; H01L 24/45; H01L 24/28; H01L 24/29; H01L 24/49; H01L 24/83; H01L 24/32; H01L 24/48; H01L 24/73
See application file for complete search history.

(56) References Cited

U.S. PATENT DOCUMENTS

| | | | | |
|---|---|---|---|---|
| 2008/0237851 | A1* | 10/2008 | Morita | H01L 24/40 257/737 |
| 2013/0062643 | A1* | 3/2013 | Muranaka | H01L 24/32 257/E33.062 |
| 2015/0262985 | A1* | 9/2015 | Takai | H01L 31/167 257/82 |
| 2016/0190045 | A1* | 6/2016 | Fujii | H01L 24/16 438/123 |
| 2017/0309544 | A1* | 10/2017 | Kobayashi | H05K 3/0061 |
| 2019/0371695 | A1* | 12/2019 | Hatano | H01L 23/562 |

FOREIGN PATENT DOCUMENTS

| | | | |
|---|---|---|---|
| JP | 2009-231716 A | 10/2009 | |
| JP | 2014-17417 A | 1/2014 | |
| JP | 2015-135956 A | 7/2015 | |
| JP | 2018-111111 A | 7/2018 | |
| JP | 2018-186182 A | 11/2018 | |
| JP | 2018-190863 A | 11/2018 | |
| JP | 7443359 A | 2/2024 | |
| WO | WO-2011036829 A1 * | 3/2011 | ........... B23K 35/007 |
| WO | 2016/121159 A1 | 8/2016 | |
| WO | 2018/181417 A1 | 10/2018 | |

OTHER PUBLICATIONS

Office Action issued in corresponding Japanese Patent application No. 2024-024424, Mar. 18, 2025, and machine translation (18 pages).

* cited by examiner

SEMICONDUCTOR DEVICE

TECHNICAL FIELD

The present disclosure relates to a semiconductor device including a semiconductor element.

BACKGROUND ART

Semiconductor devices that include a semiconductor element such as a MOSFET or an IGBT are widely known. Patent document 1 discloses an example of such semiconductor device. In this semiconductor device, a metal pattern (conductive member) is formed on a support substrate (insulation substrate). The semiconductor element is bonded to the metal pattern via a conductive bonding material.

During the use of the semiconductor device disclosed in Patent Document 1, heat is generated from the semiconductor element, and the ambient temperature increases. In particular, the conductive bonding material is often exposed to a high temperature. Repeated exposure of the conductive bonding material to the high temperature leads to a change in state of the conductive bonding material. As result, the electrical conduction between the semiconductor element and the metal pattern may be interrupted.

PRIOR ART DOCUMENTS

Patent Document

Patent Document: JP-A-2009-158787

SUMMARY OF THE INVENTION

Problem to be Solved by the Invention

In view of the foregoing situation, the present disclosure provides a semiconductor device configured to maintain a proper bonding status between the semiconductor element and a conductive member, to thereby improve the reliability on the bonding status.

Means to Solve the Problem

In an aspect, the present disclosure provides a semiconductor device including a conductive member having an obverse face, a semiconductor element mounted on the obverse face, and a conductive bonding material disposed between the conductive member and the semiconductor element to conductively bond the conductive member and the semiconductor element together. The conductive bonding material includes a metal base layer, a first bonding layer, and a second bonding layer. The first bonding layer is disposed between the metal base layer and the semiconductor element, and bonded to the semiconductor element by metal solid-phase diffusion. The second bonding layer is disposed between the metal base layer and the conductive member, and bonded to the conductive member by metal solid-phase diffusion.

Other features and advantages of the present disclosure will become more apparent, through detailed description given hereunder with reference to the accompanying drawings.

MODE FOR CARRYING OUT THE INVENTION

Hereafter, exemplary embodiments of the present disclosure will be described in detail, with reference to the drawings.

The terms "first", "second", "third", and so forth used in the present disclosure merely serve as a label, and are not intended to specify an order with respect to the objects accompanied with these terms.

Figure 1:
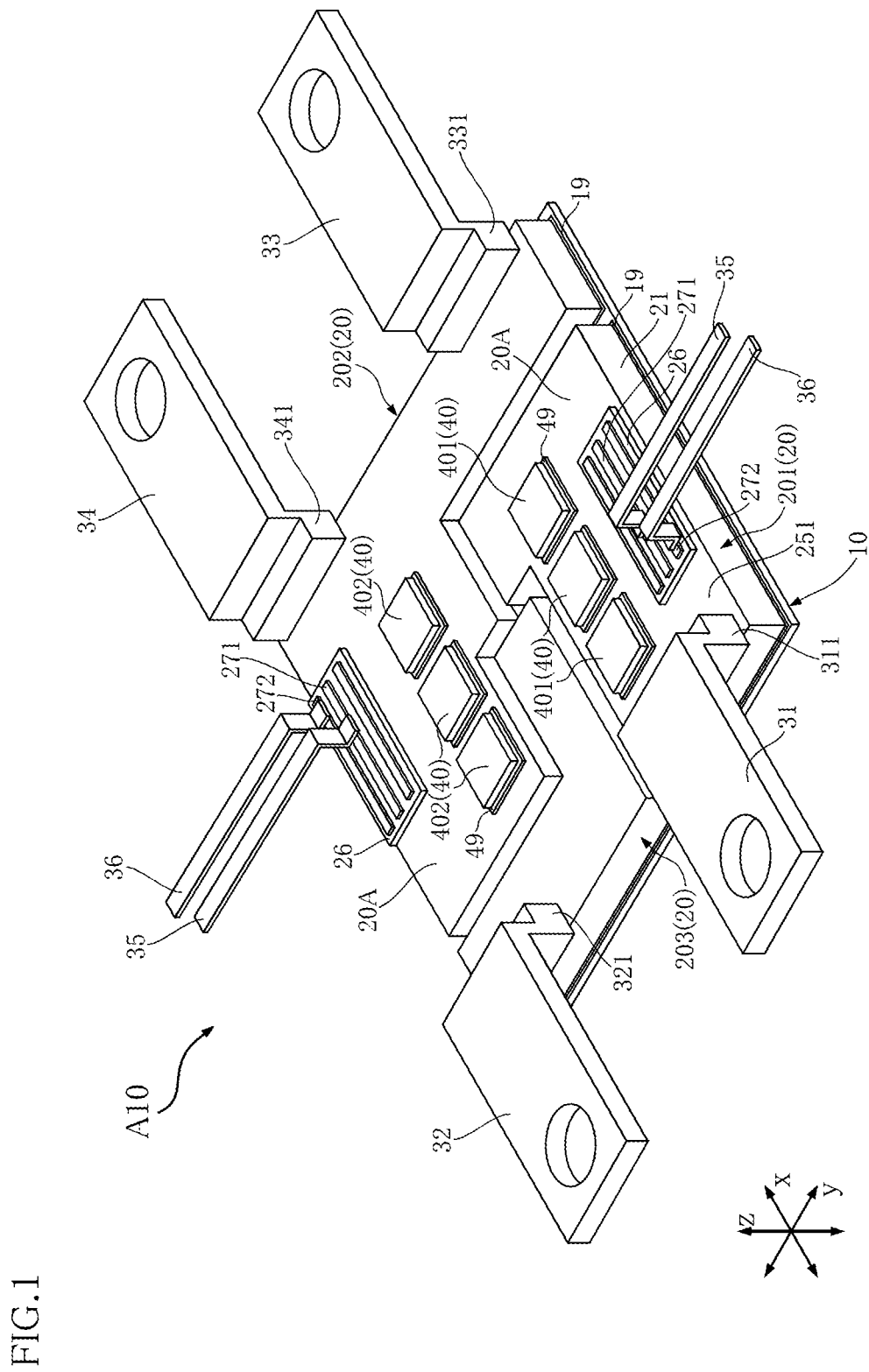
FIG. 1 is a perspective view showing a semiconductor device according to a first embodiment.
Figure 2:
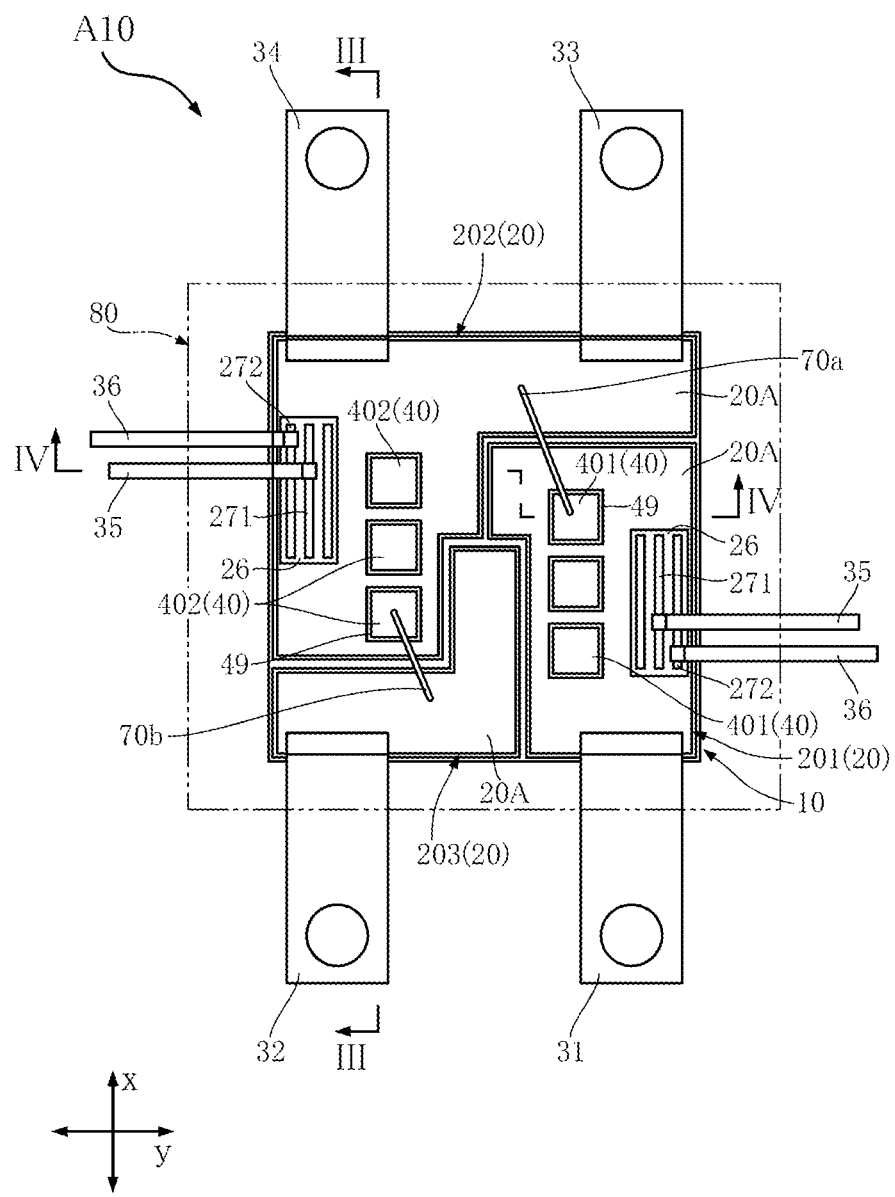
FIG. 2 is a plan view of the semiconductor device shown in FIG. 1.
Figure 3:
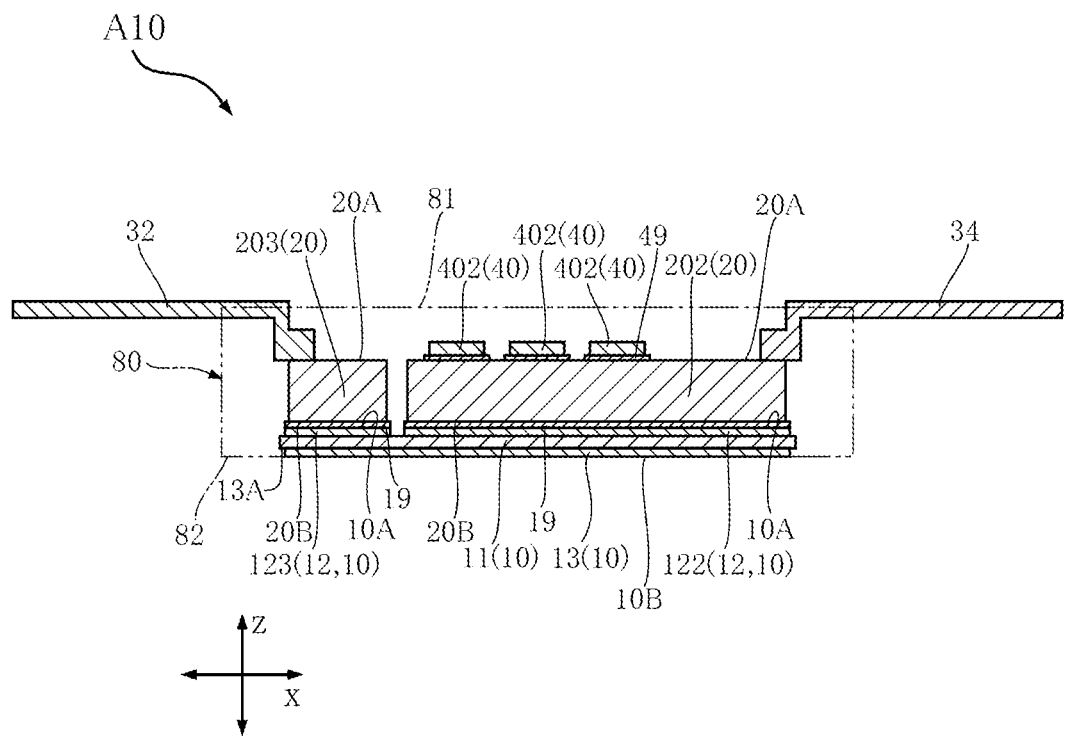
FIG. 3 is a cross-sectional view taken along a line III-III in FIG. 2.
Figure 4:
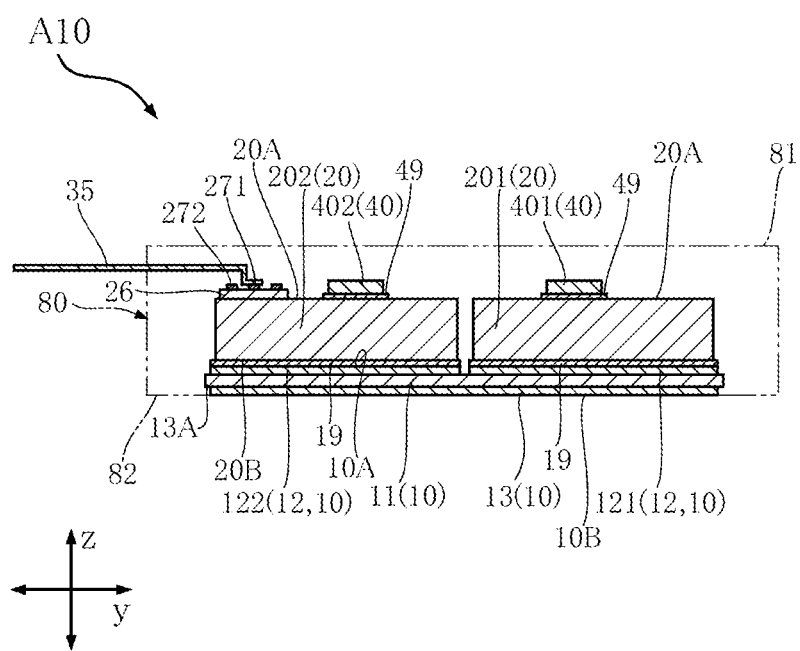
FIG. 4 is a cross-sectional view taken along a line IV-IV in FIG. 2.

Referring to FIG. 1 to FIG. 10, a semiconductor device A10 according to a first embodiment will be described hereunder. The semiconductor device A10 shown in the mentioned drawings includes a support substrate 10, a plurality of conductive members 20, a first input terminal 31, a second input terminal 32, a first output terminal 33, a second output terminal 34, a plurality of semiconductor elements 40, and a sealing resin 80 (not shown in FIG. 1). In addition, the semiconductor device A10 includes a pair of insulation layers 26, a pair of gate wiring layers 271, a pair of detection wiring layers 272, a pair of gate terminals 35, and a pair of detection terminals 36. Each of the semiconductor elements 40 is for example a MOSFET, and the semiconductor device A10 is for example a power converter (power module). The semiconductor device A10 can be utilized as a drive source of a motor, in an inverter of various electrical appliances, a DC/DC converter, and so forth. In FIG. 2 to FIG. 4, the elements are seen through the sealing resin 80 (see dash-dot-dot lines).

For the description of the semiconductor device A10, a direction that penetrates through the thickness of the support substrate 10 (or conductive member 20) will be defined as "z-direction" (or "thickness direction" as the case may be), for example as shown in FIG. 1. One direction orthogonal to the z-direction will be defined as "x-direction", and a direction orthogonal to both of the z-direction and x-direction will be defined as "y-direction". As shown in FIG. 2, the semiconductor device A10 has a rectangular shape, as viewed in the z-direction (in other words, in a plan view). The x-direction is parallel to a side of the semiconductor device A10 (e.g., left side in FIG. 2), and the y-direction is parallel to another side of the semiconductor device A10 (e.g., lower side in FIG. 2). In the description of the semiconductor device A10, when there are two elements A and B (or two groups A and B) that are spaced apart from each other in a given direction, the element A may be described as being located on one side in that direction (with respect to element B), or the element B may be described as being located on the other side in that direction (with respect to element A). Accordingly, for example in FIG. 2, such expressions as "the first input terminal 31 and the second input terminal 32 are located on one side in the x-direction", and "the first output terminal 33 and the second output terminal 34 are located on the other side in the x-direction" may be used. Here, "one side" and "the other side" may be reversed.

The support substrate 10 supports the plurality of conductive members 20, as shown in FIG. 1 to FIG. 4. In the illustrated example, the support substrate 10 has a square shape as viewed in the z-direction. The support substrate 10 includes a support face 10A and a bottom face 10B oriented in opposite directions (spaced apart from each other) in the z-direction. The support face 10A is opposed to each of the conductive members 20. As shown in FIG. 3 and FIG. 4, the bottom face 10B is exposed from the sealing resin 80. When the semiconductor device A10 is attached, for example to a heatsink, the bottom face 10B is opposed to the heatsink. In the illustrated example, the support substrate 10 includes a first support plate 11, a second support plate 12, and a bottom plate 13.

As shown in FIG. 3 and FIG. 4, the first support plate 11 is disposed between the second support plate 12 and the bottom plate 13, in the z-direction. The first support plate 11 is electrically insulative. The first support plate 11 is formed of a ceramic having high thermal conductivity. An example of the ceramic is aluminum nitride (AlN).

Each second support plate 12 is stacked on the first support plate 11, and includes the support face 10A. A corresponding one of the conductive members 20 is bonded to the second support plate 12. The second support plate 12 is made of a metal, for example in the form of a metal foil. The second support plate 12 is formed of copper (Cu) or a copper-based alloy, and electrically conductive. In the illustrated example, the second support plate 12 includes three regions (support plates), namely a first region 121, a second region 122, and a third region 123. The three regions are spaced apart from one another.

The bottom plate 13 is stacked on the first support plate 11, on the opposite side of the second support plate 12. The bottom plate 13 includes a bottom face 10B. The bottom plate 13 is made of a metal like the second support plate 12, and formed of a metal foil constituted of copper or a copper-based alloy. The second support plate 12 is electrically conductive. As is apparent from FIG. 3 and FIG. 4, the bottom plate 13 is smaller in area than the first support plate 11, as viewed in the z-direction. The peripheral edge of the first support plate 11 is located on the outer side of the peripheral edge of the bottom plate 13. Accordingly, the support substrate 10 includes a stepped portion 13A surrounding the bottom plate 13, as viewed in the z-direction. The stepped portion 13A is covered with the sealing resin 80.

The support substrate 10 can be formed, for example, from a direct bonded copper (DBC) substrate. The DBC substrate includes a ceramic plate, and a pair of copper foils holding the ceramic plate from the respective sides in the z-direction. The ceramic plate corresponds to the first support plate 11. The second support plate 12 and the bottom plate 13 can be obtained, by partially removing each of the pair of copper foils by an etching process.

As shown in FIG. 3 and FIG. 4, a bonding material 19 is provided so as to cover the support face 10A of each of the first region 121, the second region 122, and the third region 123. In other words, the bonding material 19 covers at least a part of the support face 10A of the support substrate 10.

As shown in FIG. 3 and FIG. 4, the conductive members 20 are each bonded to the corresponding one of the second support plates 12, via the bonding material 19. The plurality of conductive members 20 constitute a predetermined conduction path in the semiconductor device A10, in collaboration with the first input terminal 31, the second input terminal 32, the first output terminal 33, and the second output terminal 34. The conductive members 20 each include an obverse face 20A and a reverse face 20B oriented in opposite directions in the z-direction, and the reverse face 20B is opposed to the support face 10A of the support substrate 10.

In the semiconductor device A10, the conductive member 20 is, for example, formed of a metal plate. The metal plate is, for example, made of copper or a copper-based alloy. As shown in FIG. 3 and FIG. 4, the conductive member 20 is thicker than the second support plate 12. The conductive member 20 may be formed of a plurality of metal layers stacked on the metal plate, for example including a silver plated or aluminum layer, a nickel (Ni) layer, and silver layer stacked in this order. As will be subsequently described in further detail (see FIG. 9 and FIG. 10), in this embodiment the conductive member 20 includes a base material 24 formed of a metal, and a conductor layer 25 formed on the base material 24.

As shown in FIG. 2 to FIG. 4, the plurality of conductive members 20 include a first conductive member 201, a second conductive member 202, and a third conductive member 203. The first conductive member 201 is bonded to the first region 121 of the second support plate 12. The second conductive member 202 is bonded to the second region 122 of the second support plate 12. The third conductive member 203 is bonded to the third region 123 of the second support plate 12. Accordingly, the first conductive member 201, the second conductive member 202, and the third conductive member 203 are spaced apart from one another.

As shown in FIG. 1, FIG. 2, and FIG. 4, the pair of insulation layers 26 are respectively located on the obverse face 20A of the first conductive member 201 and the second conductive member 202. The pair of insulation layers 26 are spaced apart from each other in the y-direction. The pair of insulation layers 26 each have a belt-like shape extending in the x-direction. The insulation layer 26 is, for example, formed of a ceramic or a glass epoxy resin. At least the surface of the insulation layer 26 may be formed of insulative SiC.

The pair of gate wiring layers 271 are respectively provided on the pair of insulation layers 26. The pair of gate wiring layers 271 each have a belt-like shape extending in the x-direction. The pair of detection wiring layers 272 are respectively provided on the pair of insulation layers 26. The pair of detection wiring layers 272 each have a belt-like shape extending in the x-direction. The gate wiring layer 271 and the detection wiring layer 272 are located side by side, on each of the insulation layers 26. The gate wiring layer 271 and the detection wiring layer 272 are, for example, formed of a metal foil made of copper or a copper-based alloy.

As shown in FIG. 1 and FIG. 2, the first input terminal 31 and the second input terminal 32 are located on one side in the x-direction. The first input terminal 31 and the second input terminal 32 are spaced apart from each other in the y-direction. The first input terminal 31 and the second input terminal 32 receive a DC power (voltage), the object of the power conversion. The first input terminal 31 is the positive electrode (P terminal), and the second input terminal 32 is the negative electrode (N terminal). The first input terminal 31 and the second input terminal 32 are each formed of a metal plate. The metal plate is formed of copper, or a copper-based alloy.

The first input terminal 31 includes a bent portion 311, bent in a stepped shape, and formed on the end portion on the other side in the x-direction. The bent portion 311 is bonded to the obverse face 20A of the first conductive member 201, by soldering or ultrasonic bonding. Accordingly, the first input terminal 31 is electrically connected to the first conductive member 201. The second input terminal 32 includes a bent portion 321, bent in a stepped shape, and formed on the end portion on the other side in the x-direction. The bent portion 321 is bonded to the obverse face 20A of the third conductive member 203, by soldering or ultrasonic bonding. Accordingly, the second input terminal 32 is electrically connected to the third conductive member 203.

As shown in FIG. 1 and FIG. 2, the first output terminal 33 and the second output terminal 34 are located on the other side in the x-direction. The first output terminal 33 and the second output terminal 34 are spaced apart from each other, in the y-direction. From the first output terminal 33 and the second output terminal 34, AC power (voltage) converted by the plurality of semiconductor elements 40 is outputted. The first output terminal 33 and the second output terminal 34 are each formed of a metal plate. The metal plate is formed of copper, or a copper-based alloy. The first output terminal 33 and the second output terminal 34 respectively include a bent portion 331 and a bent portion 341, each bent in a stepped shape and formed on the end portion on one side in the x-direction. The bent portion 331 and the bent portion 341 are bonded to the obverse face 20A of the second conductive member 202, by soldering or ultrasonic bonding. Accordingly, the first output terminal 33 and the second output terminal 34 are electrically connected to the second conductive member 202. Here, although two output terminals (first output terminal 33 and second output terminal 34) are provided in the illustrated example, these output terminals may be unified into a single output terminal.

The pair of gate terminals 35 and the pair of detection terminals 36 are respectively connected to the pair of gate wiring layers 271 and the pair of detection wiring layers 272. The pair of gate terminals 35 and the pair of detection terminals 36 are each formed of a metal plate and extend in the y-direction. The metal plate is formed of copper or a copper-based alloy.

An end portion of each of the pair of gate terminals 35 and the pair of detection terminals 36 is bent in a stepped shape. The end portion of each of the gate terminals 35 is connected to the corresponding gate wiring layer 271, by soldering or ultrasonic bonding. The end portion of each of the detection terminals 36 is connected to the corresponding detecting wiring layer 272, by soldering or ultrasonic bonding.

The semiconductor element 40 is, for example, a metal-oxide-semiconductor field-effect transistor (MOSFET) formed of a semiconductor predominantly composed of silicon carbide (SiC). The semiconductor element 40 may be a field-effect transistor such as a metal-insulator-semiconductor field-effect transistor (MOSFET), or a bipolar transistor such as an insulated gate bipolar transistor (IGBT), without limitation to the MOSFET. For the description of the semiconductor device A10, it will be assumed that the semiconductor element 40 is a switching element, constituted of an n-channel type MOSFET.

Figure 5:
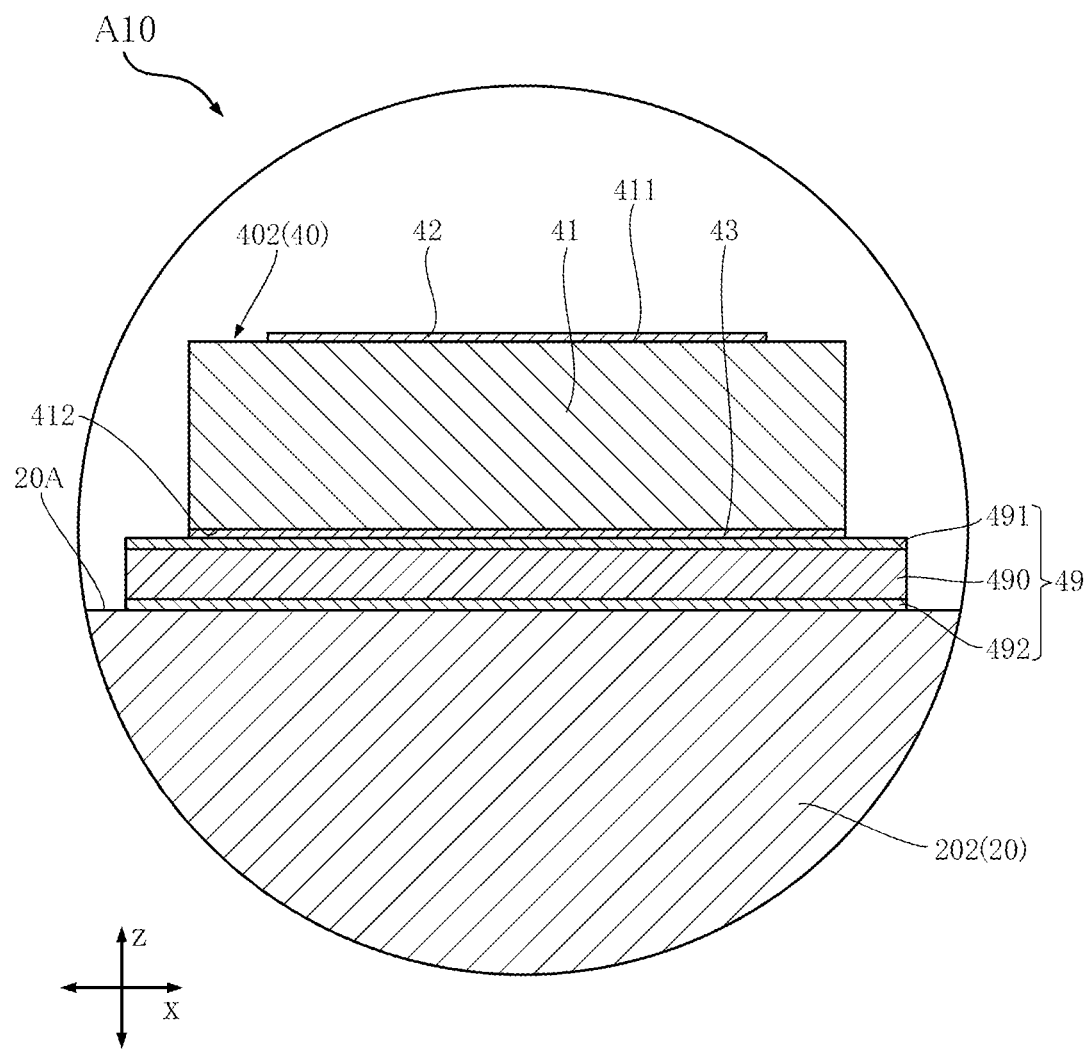
FIG. 5 is a partially enlarged cross-sectional view from FIG. 3.

As shown in FIG. 5, the semiconductor element 40 includes an element main body 41, an obverse face electrode 42, a reverse face electrode 43, and a gate electrode (not shown). The element main body 41 includes an element obverse face 411 and an element reverse face 412. The element obverse face 411 and the element reverse face 412 are oriented in opposite directions in the z-direction. The element obverse face 411 is oriented to the same side as is the obverse face 20A of the conductive member 20, in the z-direction. Accordingly, the element reverse face 412 is opposed to the obverse face 20A.

As shown in FIG. 5, the obverse face electrode 42 is provided on the element obverse face 411. To the obverse face electrode 42, a source current flows from inside of the element main body 41. The reverse face electrode 43 is provided on the element reverse face 412. The reverse face electrode 43 includes silver, or a plurality of metal layers such as a nickel layer and a silver layer, stacked on each other. Through the reverse face electrode 43, a drain current flows toward the inside of the element main body 41. The reverse face electrode 43 is electrically connected to the obverse face 20A of the conductive member 20, via a conductive bonding material 49. The gate electrode is provided on the element obverse face 411, and a gate voltage for driving the semiconductor element 40 is applied to the gate electrode.

Figure 6:
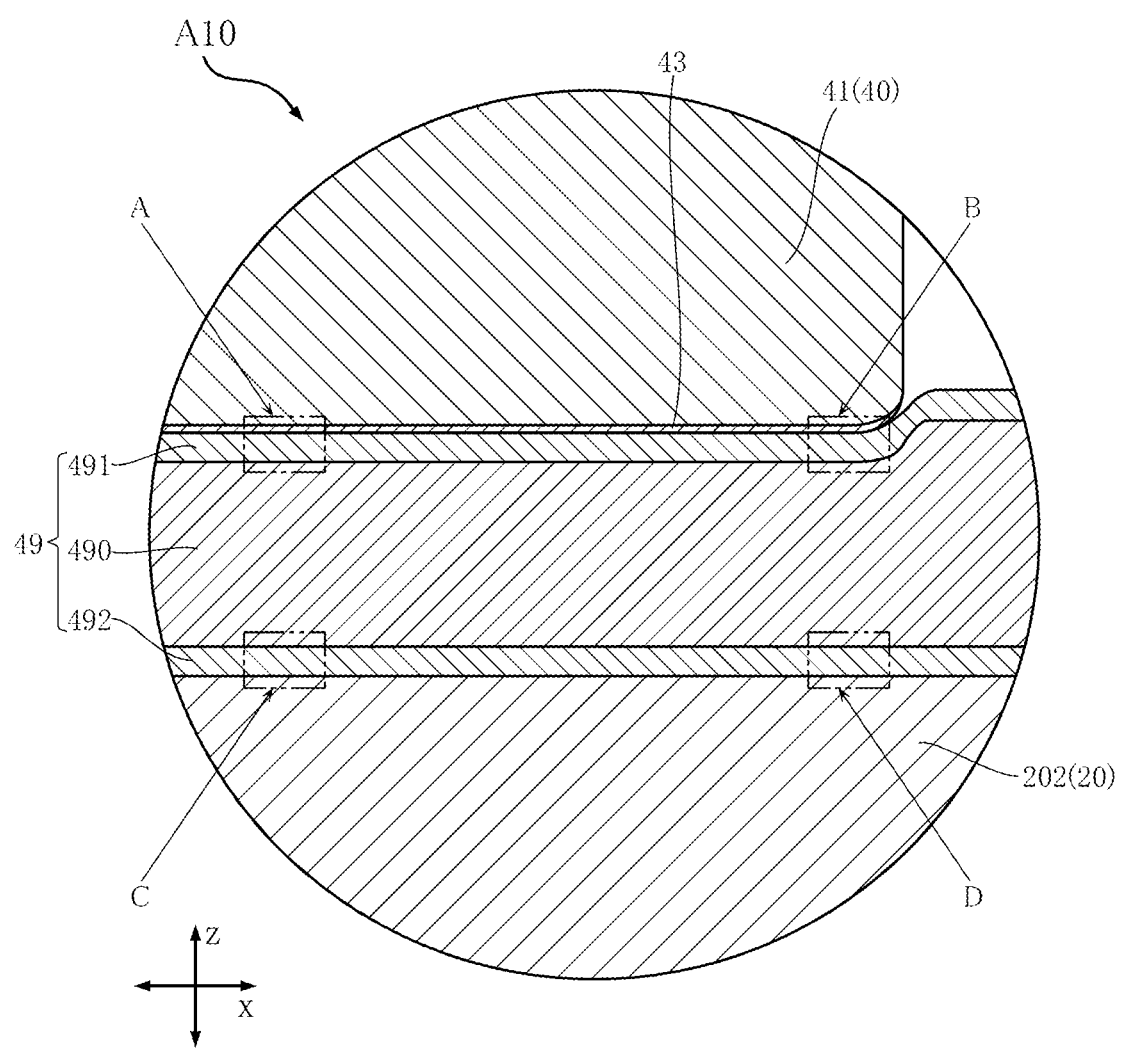
FIG. 6 is a partially enlarged cross-sectional view from FIG. 5.

The conductive bonding material 49 is disposed between the conductive member 20 and the semiconductor element 40. The conductive bonding material 49 is larger in size than the semiconductor element 40 as viewed in the z-direction, and the entirety of the semiconductor element 40 overlaps with the conductive bonding material 49, as viewed in the z-direction. The conductive bonding material 49 is composed of a plurality of metal layers stacked on each other. As shown in FIG. 5 and FIG. 6, in the semiconductor device A10, the conductive bonding material 49 includes a metal base layer 490, a first bonding layer 491, and a second bonding layer 492. As shown in FIG. 7 to FIG. 10, the conductive bonding material 49 also includes a first intermediate layer 493 and a second intermediate layer 494.

The metal base layer 490 occupies a major part of the volume of the conductive bonding material 49. The thickness of the metal base layer 490 is, for example, approximately 10 to 200 μm. The material of the metal base layer 490 includes at least one of, for example, aluminum (Al), titanium (Ti), zinc (Zn), hafnium (Hf), and erbium (Er). In this embodiment, the material of the metal base layer 490 contains aluminum. When the metal base layer 490 is formed of aluminum, the Young's modulus of the metal base layer 490 is 70.3 GPa.

Figure 7:
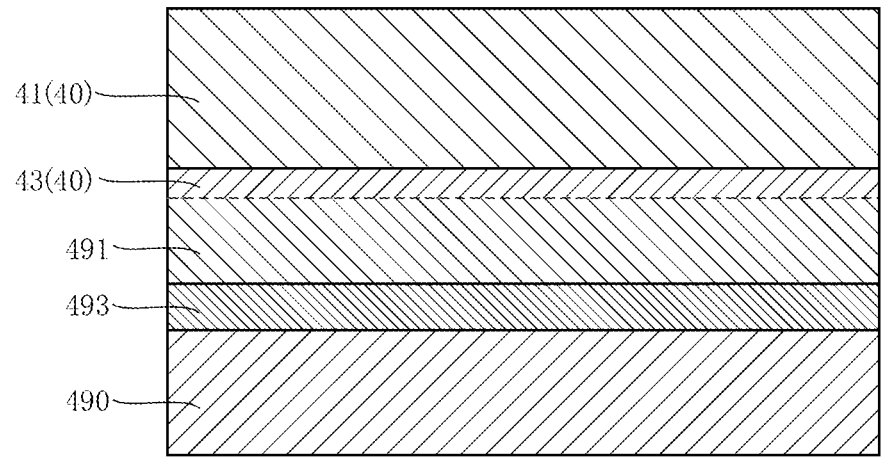
FIG. 7 is an enlarged cross-sectional view of a portion A in FIG. 6.
Figure 8:
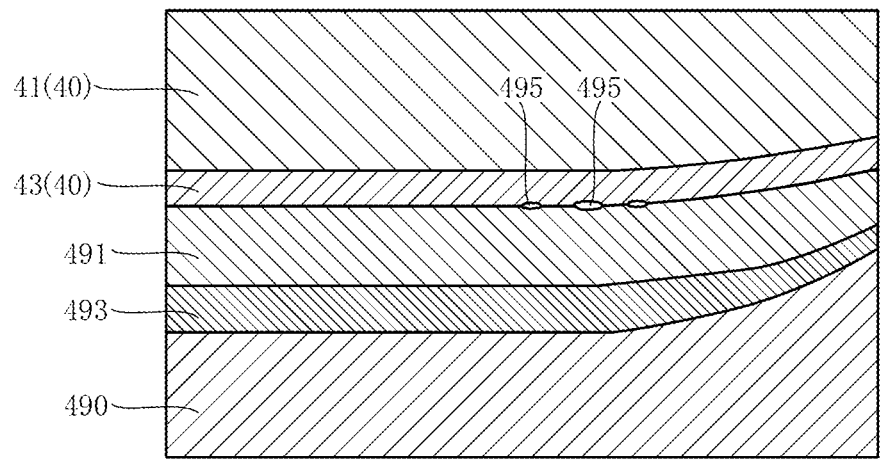
FIG. 8 is an enlarged cross-sectional view of a portion B in FIG. 6.

The first bonding layer 491 is disposed between the metal base layer 490 and the semiconductor element 40. In this embodiment, as shown in FIG. 7 and FIG. 8, the first bonding layer 491 is formed on the first intermediate layer 493. The material of the first bonding layer 491 includes at least one of, for example, silver (Ag), copper (Cu), and gold (Au). In this embodiment, the material of the first bonding layer 491 contains silver. The first bonding layer 491 is bonded to the semiconductor element 40 (reverse face electrode 43), by metal solid-phase diffusion. The material of the reverse face electrode 43 contains, for example, silver. The reverse face electrode 43 is thinner than the first bonding layer 491. The reverse face electrode 43 is formed, for example, through a sputtering process.

Figure 9:
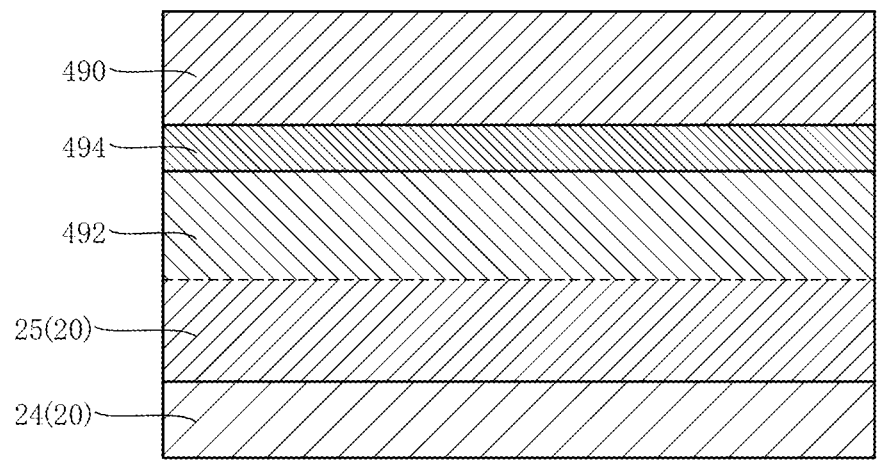
FIG. 9 is an enlarged cross-sectional view of a portion C in FIG. 6.
Figure 10:
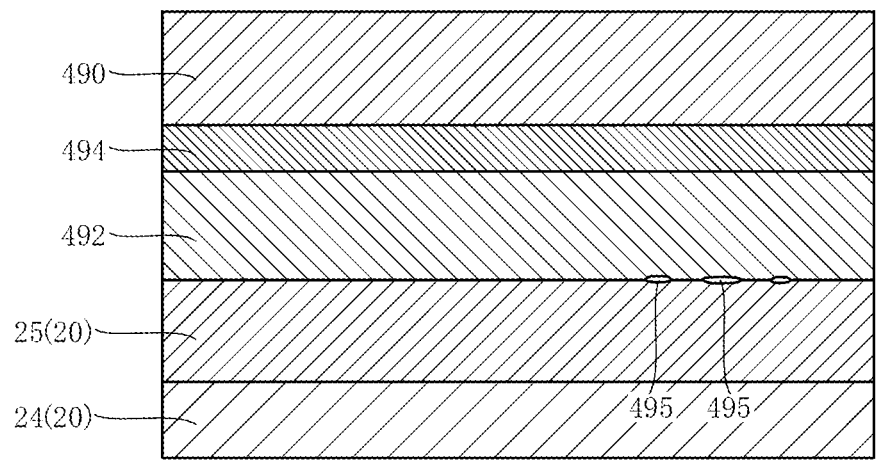
FIG. 10 is an enlarged cross-sectional view of a portion D in FIG. 6.

The second bonding layer 492 is disposed between the metal base layer 490 and the conductive member 20. In this embodiment, as shown in FIG. 9 and FIG. 10, the second bonding layer 492 is formed on the second intermediate layer 494. The material of the second bonding layer 492 includes at least one of, for example, silver, copper, and gold. In this embodiment, the material of the second bonding layer 492 contains silver. The second bonding layer 492 is bonded to the conductive member 20 (conductor layer 25), by metal solid-phase diffusion. In this embodiment, the conductive member 20 includes the base material 24, and the conductor layer 25 formed thereon, and the second bonding layer 492 and the conductor layer 25 are bonded to each other by solid-phase diffusion. For example, the material of the conductor layer 25 contains silver.

When the first bonding layer 491 and the second bonding layer 492 are each formed of silver, the Young's modulus of the first bonding layer 491 and the second bonding layer 492 is 82.7 GPa. Accordingly, as is apparent from the Young's modulus of the metal base layer 490 (70.3 GPa), the Young's modulus of the metal base layer 490 is smaller than that of the first bonding layer 491 and the second bonding layer 492. The first bonding layer 491 and the second bonding layer 492 each have a thickness of, for example, approximately 2 to 5 μm, which is thinner than the metal base layer 490.

As shown in FIG. 7 and FIG. 8, the first intermediate layer 493 is disposed between the metal base layer 490 and the first bonding layer 491. In this embodiment, the first intermediate layer 493 is formed on the metal base layer 490. As shown in FIG. 9 and FIG. 10, the second intermediate layer 494 is disposed between the metal base layer 490 and the second bonding layer 492. In this embodiment, the second intermediate layer 494 is formed on the metal base layer 490. The material of each of the first intermediate layer 493 and the second intermediate layer 494 contains, for example, nickel (Ni). When the first intermediate layer 493 and the second intermediate layer 494 are each formed of nickel, the Young's modulus of each of the first intermediate layer 493 and the second intermediate layer 494 is 200 GPa. The first intermediate layer 493 and the second intermediate layer 494 each have a thickness of, for example, approximately 0.2 to 2 μm, which is thinner than the first bonding layer 491 and the second bonding layer 492.

The layered structure of the conductive bonding material 49 is, for example, formed through a sputtering process or plating process. In the case of the sputtering process, metal layers corresponding to the first intermediate layer 493 and the first bonding layer 491, and metal layers corresponding to the second intermediate layer 494 and the second bonding layer 492, are sequentially formed on the respective surfaces of an aluminum sheet material corresponding to the metal base layer 490. In the case of the plating process, plated layers of the material of the first intermediate layer 493 and the second intermediate layer 494, and plated layers of the material of the first bonding layer 491 and the second bonding layer 492, are sequentially formed over the entire surface of the aluminum sheet. Then upon cutting the sheet-shape layered structure, a plurality of pieces of the conductive bonding material 49 can be obtained.

Hereunder, a method of bonding the conductive member 20 and the semiconductor element 40 together will be described.

First, the conductive bonding material 49 and the semiconductor element 40 are stacked on the obverse face 20A of the conductive member 20. At this point, the conductive member (conductor layer 25) and the second bonding layer 492, and also the first bonding layer 491 and the semiconductor element 40 (reverse face electrode 43), enter into contact with each other.

Figure 11:
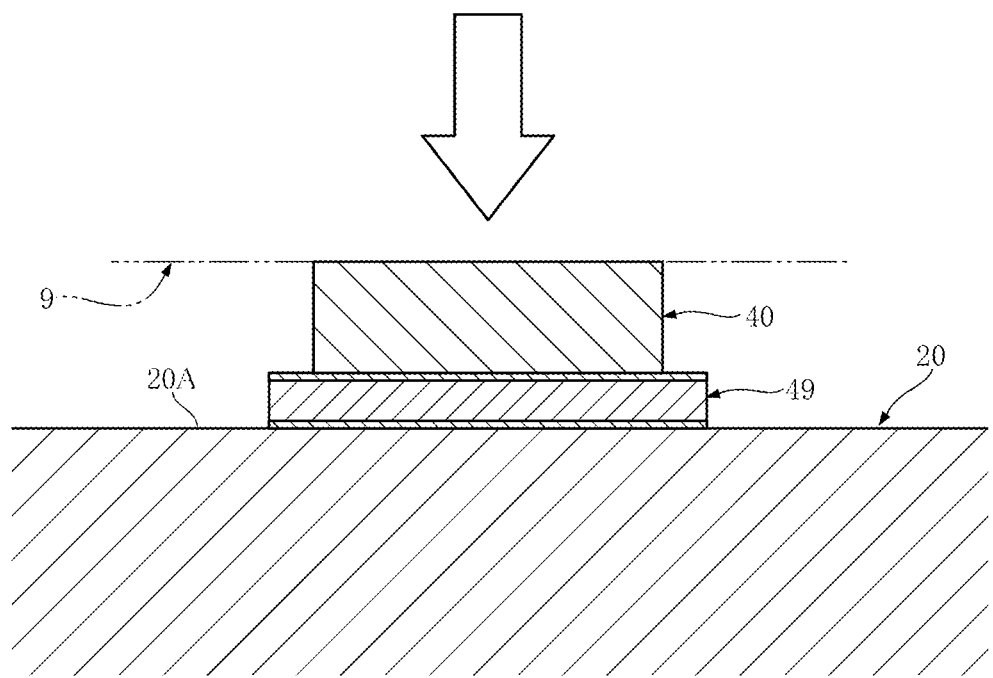
FIG. 11 is a cross-sectional view for explaining a method of bonding a semiconductor element and a conductive member together.

Then the conductive member 20 (conductor layer 25) and the second bonding layer 492, and also the first bonding layer 491 and the semiconductor element 40 (reverse face electrode 43), are bonded to each other by solid-phase diffusion. The solid-phase diffusion bonding is performed under a high temperature and a high pressure. The solid-phase diffusion bonding is performed, for example as shown in FIG. 11, while pressing the semiconductor element 40 stacked in position with a flat pressing member 9. The conditions that cause the solid-phase diffusion include, for example, a temperature of approximately 350° C., and a pressure of approximately 40 MPa. However, the temperature and pressure conditions for causing the solid-phase diffusion may be selected as desired. Although it is assumed that the solid-phase diffusion bonding is performed in the atmosphere, the solid-phase diffusion bonding may be performed in a vacuum.

When the conductive member 20 and the semiconductor element 40 are bonded to each other via the conductive bonding material 49, by solid-phase diffusion, a portion of the conductive bonding material 49 overlapping with the semiconductor element 40 as viewed in the z-direction is slightly recessed, owing to the pressure from the side of the semiconductor element 40. As result, as shown in FIG. 6, a stepped portion is formed in the conductive bonding material 49, along the boundary between the portion overlapping with the semiconductor element 40 as viewed in the z-direction, and the portion not overlapping with the semiconductor element 40 as viewed in the z-direction.

As shown in FIG. 6, FIG. 8, and FIG. 10, in a region close to the boundary between the portions of the conductive bonding material 49 overlapping with the semiconductor element 40 and not overlapping therewith, as viewed in the z-direction, voids 495 may be formed in the interface between the first bonding layer 491 and the reverse face electrode 43 (semiconductor element 40), and the interface between the second bonding layer 492 and the conductor layer 25 (conductive member 20). On the other hand, as shown in FIG. 6, FIG. 7, and FIG. 9, in a region slightly on the inner side of the boundary between the portions of the conductive bonding material 49 overlapping with the semiconductor element 40 and not overlapping therewith, as viewed in the z-direction (where conductive bonding material 49 overlaps with semiconductor element 40 as viewed in z-direction), the interface between the first bonding layer 491 and the reverse face electrode 43 (semiconductor element 40), and the interface between the second bonding layer 492 and the conductor layer 25 (conductive member 20), are difficult to visually recognize. This is because the first bonding layer 491 and the reverse face electrode 43, also the second bonding layer 492 and the conductor layer 25 are all formed of silver, by solid-phase diffusion bonding of the same metal. In the enlarged cross-sectional views of FIG. 7 and FIG. 10, the interface between the first bonding layer 491 and the reverse face electrode 43 (semiconductor element 40), and the interface between the second bonding layer 492 and the conductor layer 25 (conductive member 20) are schematically indicated by dot lines. As may be understood from the above, the first bonding layer 491 and the reverse face electrode 43, and the second bonding layer 492 and the conductor layer 25, are firmly bonded by solid-phase diffusion. The firmly bonded state of the solid-phase diffusion can be confirmed, for example, by an enlarged image (e.g., SEM image) of the cross-section of the bonded portion.

The plurality of semiconductor elements 40 include a plurality of first elements 401, and a plurality of second elements 402. As shown in FIG. 1, FIG. 2, and FIG. 4, the plurality of first elements 401 are electrically connected to the obverse face 20A of the first conductive member 201. The plurality of first elements 401 are aligned at predetermined intervals, along the x-direction. The plurality of first elements 401 constitute an upper arm circuit on the semiconductor device A10.

As shown in FIG. 1 to FIG. 4, the plurality of second elements 402 are electrically connected to the obverse face 20A of the second conductive member 202. The plurality of second elements 402 are aligned at predetermined intervals, along the x-direction. The plurality of second elements 402 constitute a lower arm circuit on the semiconductor device A10.

As shown in FIG. 2, the plurality of first elements 401 are deviated along the x-direction, with respect to the plurality of second elements 402. In the illustrated example, three first elements 401 and three second elements 402 are provided. The number of each of the first elements 401 and the second elements 402 is not limited to this example, but may be determined as desired, depending on the performance required from the semiconductor device A10.

The obverse face electrode 42 of each of the plurality of first elements 401 and the obverse face 20A of the second conductive member 202 are, for example, connected via a wire 70a (FIG. 2 only illustrates a single wire 70a, for the sake of simplicity). Accordingly, the obverse face electrode 42 of each of the plurality of first elements 401 is electrically connected to the second conductive member 202, via the wire. Therefore, the first output terminal 33 is electrically connected to the obverse face electrode 42 of each of the plurality of first elements 401, via the second conductive member 202 and the wire. The first output terminal 33 serves as the source terminal of the plurality of first elements 401.

The reverse face electrode 43 of each of the plurality of first elements 401 and the first conductive member 201 are electrically connected to each other, via the conductive bonding material 49. Accordingly, the first input terminal 31 is electrically connected to the reverse face electrode 43 of each of the plurality of first elements 401, via the first conductive member 201. The first input terminal 31 serves as the drain terminal of the plurality of first elements 401.

The obverse face electrode 42 of each of the plurality of second elements 402 and the obverse face 20A of the third conductive member 203 are, for example, connected via a wire 70b (FIG. 2 only illustrates a single wire 70b, for the sake of simplicity). Accordingly, the obverse face electrode 42 of each of the plurality of second elements 402 is electrically connected to the third conductive member 203, via the wire. Therefore, the second input terminal 32 is electrically connected to the obverse face electrode 42 of each of the plurality of second elements 402, via the third conductive member 203 and the wire. The second input terminal 32 serves as the source terminal of the plurality of second elements 402.

The reverse face electrode 43 of each of the plurality of second elements 402 and the second conductive member 202 are electrically connected to each other, via the conductive bonding material 49. Accordingly, the second output terminal 34 is electrically connected to the reverse face electrode 43 of each of the plurality of second elements 402, via the first conductive member 201. The second output terminal 34 serves as the drain terminal of the plurality of second elements 402.

The semiconductor device A10 includes a plurality of non-illustrated gate wires and detection wires. The plurality of gate wires are respectively provided for the plurality of first elements 401 and the plurality of second elements 402. Each gate wire corresponding to the first element 401 is connected to the gate electrode (not shown) of the first element 401, and one of the gate wiring layers 271 on the first conductive member 201. Each gate wire corresponding to the second element 402 is connected to the gate electrode (not shown) of the second element 402, and the other gate wiring layer 271 on the second conductive member 202. To each of the pair of gate terminals 35, connected to one of the pair of gate wiring layers 271, a gate voltage for driving either the plurality of first elements 401 or the plurality of second elements 402 is applied.

The plurality of detection wires are respectively provided for the plurality of first elements 401 and the plurality of second elements 402. Each detection wire corresponding to the first element 401 is connected to the obverse face electrode 42 of the first element 401, and one of the detection wiring layers 272 on the first conductive member 201. Each detection wire corresponding to the second element 402 is connected to the obverse face electrode 42 of the second element 402 and the other detection wiring layer 272 on the second conductive member 202. From each of the pair of detection terminals 36, connected to one of the pair of detection wiring layers 272, a voltage to be applied to the plurality of obverse face electrodes 42 of one of the plurality of first elements 401 and the plurality of second elements 402 (voltage based on source current) is outputted.

The sealing resin 80 covers, as shown in FIG. 2 to FIG. 4, a part of each of the support substrate 10, the first input terminal 31, the second input terminal 32, the first output terminal 33, and the second output terminal 34, the conductive member 20, and the plurality of semiconductor elements 40. The sealing resin 80 covers the pair of insulation layers 26, the pair of gate wiring layers 271, the pair of detection wiring layers 272, and the wires cited above. Further, the sealing resin 80 covers a part of each of the pair of gate terminals 35 and the pair of detection terminals 36. The sealing resin 80 is, for example, formed of a black epoxy resin.

As shown in FIG. 3 and FIG. 4, the sealing resin 80 includes a resin obverse face 81 and a resin bottom face 82. The resin obverse face 81 is oriented to the same side as is the support face 10A of the support substrate 10, in the z-direction. The resin bottom face 82 is oriented to the opposite side of the resin obverse face 81, in the z-direction. From the resin bottom face 82, the bottom face 10B of the bottom plate 13 (support substrate 10) is exposed. The resin bottom face 82 has a frame shape surrounding the bottom plate 13. The portions of the pair of gate terminals 35 and the pair of detection terminals 36 exposed from the sealing resin 80 may be bent as desired, depending on the form of use of the semiconductor device A10.

The semiconductor device A10 provides the following advantageous effects.

In the semiconductor device A10, the conductive bonding material 49 disposed between the conductive member 20 and the semiconductor element 40 includes the metal base layer 490, the first bonding layer 491, and the second bonding layer 492, and the metal base layer 490 is disposed between the first bonding layer 491 and the second bonding layer 492. With such a configuration, the metal base layer 490 located at the intermediate position serves as a cushion, when the first bonding layer 491 and the semiconductor element 40 (reverse face electrode 43) are bonded to each other, and also when the second bonding layer 492 and the conductive member 20 (conductor layer 25) are bonded to each other. Therefore, the pressure imposed on the interface between the first bonding layer 491 and the semiconductor element 40 (reverse face electrode 43), and the interface between the second bonding layer 492 and the conductive member 20 (conductor layer 25), can be levelled off. In addition, the first bonding layer 491 and the semiconductor element 40 (reverse face electrode 43), and also the second bonding layer 492 and the conductive member 20 (conductor layer 25), can be firmly bonded to each other, by solid-phase diffusion bonding. As result, the bonding status provided by the conductive bonding material 49 can be prevented from changing (deteriorating), despite the conductive bonding material 49 being repeatedly exposed to a high temperature, owing to the heat generated in the semiconductor element 40, when the semiconductor device A10 is in use. Consequently, the semiconductor device A10 including the conductive bonding material 49 improves the reliability in terms of the bonding status between the semiconductor element 40 and the conductive member 20.

In this embodiment, the Young's modulus of the metal base layer 490 is smaller than that of the material of each of the first bonding layer 491 and the second bonding layer 492. Accordingly, when the conductive bonding material 49 is bonded to the semiconductor element 40 (reverse face electrode 43) and the conductive member 20 (conductor layer 25) by solid-phase diffusion, the stress is mitigated by the metal base layer 490, which is relatively softer, and therefore the bonding interface can be smoothed. As result, the first bonding layer 491 and the semiconductor element 40 (reverse face electrode 43), and the second bonding layer 492 and the conductive member 20 (conductor layer 25), can be bonded with increased strength, by solid-phase diffusion.

In this embodiment, the metal base layer 490 is thicker than the first bonding layer 491 and the second bonding layer 492. Accordingly, when the solid-phase diffusion bonding is performed, the pressure imposed on the interface between the first bonding layer 491 and the semiconductor element 40 (reverse face electrode 43), and the interface between the second bonding layer 492 and the conductive member 20 (conductor layer 25) can be more effectively levelled off. Consequently, the first bonding layer 491 and the semiconductor element 40 (reverse face electrode 43), and the second bonding layer 492 and the conductive member 20 (conductor layer 25), can be conductively bonded to each other, with further increased bonding strength.

The conductive bonding material 49 includes the first intermediate layer 493 and the second intermediate layer 494. The first intermediate layer 493 is disposed between the metal base layer 490 and the first bonding layer 491, and the second intermediate layer 494 is disposed between the metal base layer 490 and the second bonding layer 492. The presence of the first intermediate layer 493 and the second intermediate layer 494 is advantageous in levelling off the pressure imposed on the interface between the first bonding layer 491 and the semiconductor element 40 (reverse face electrode 43), and the interface between the second bonding layer 492 and the conductive member 20 (conductor layer 25), when the solid-phase diffusion bonding is performed. In addition, since the first intermediate layer 493 and the second intermediate layer 494 are each formed of nickel, the Young's modulus of the first intermediate layer 493 and the second intermediate layer 494 is relatively large. In this case, the pressure imposed on the bonding interface, during the solid-phase diffusion bonding process, can be made more even, and consequently the first bonding layer 491 and the semiconductor element 40 (reverse face electrode 43), and the second bonding layer 492 and the conductive member 20 (conductor layer 25), can be conductively bonded to each other, with further increased bonding strength.

In this embodiment, the first bonding layer 491 and the second bonding layer 492 each contain silver. With such a configuration, the first bonding layer 491 and the second bonding layer 492 are prevented from being oxidized when the solid-phase diffusion bonding is performed using the conductive bonding material 49, and therefore the quality of the solid-phase diffusion bonding can be improved. Further, since the reverse face electrode 43 and the conductor layer 25, respectively bonded to the first bonding layer 491 and the second bonding layer 492, also contain silver, the quality of the solid-phase diffusion bonding can be further improved.

Although the configuration of the bonding material 19, disposed between the conductive member 20 and the support substrate 10 (second support plate 12) as shown in FIG. 3 and FIG. 4, is not specifically limited, the bonding material 19 may be formed similarly to the conductive bonding material 49. The bonding material 19 includes, for example, a plurality of metal layers stacked on each other, which are bonded by solid-phase diffusion. The bonding material 19 may include, like the conductive bonding material 49, a metal base layer, a first bonding layer, a second bonding layer, a first intermediate layer, and a second intermediate layer. The metal base layer, the first bonding layer, the second bonding layer, the first intermediate layer, and the second intermediate layer may be configured similarly to the metal base layer 490, the first bonding layer 491, the second bonding layer 492, the first intermediate layer 493, and the second intermediate layer 494, respectively, of the conductive bonding material 49. In this case, the first bonding layer of the bonding material 19 is bonded to the conductive member 20 by metal solid-phase diffusion, and the second bonding layer of the bonding material 19 is bonded to the support substrate 10 (second support plate 12), by metal solid-phase diffusion.

Referring now to FIG. 12 to FIG. 20, a semiconductor device A20 according to a second embodiment will be described hereunder. The semiconductor device A20 illustrated in the mentioned drawings includes a base member 1, a conductive member 2, a semiconductor laser element 4, a switching element 5, a capacitor 6, first wires 71, second wires 72, a third wire 73, and a light-transmitting resin 8. The semiconductor device A20 is used, for example, as pulse laser source for a LiDAR, an example of two-dimensional ranging device, but the present disclosure is not limited thereto.

Figure 12:
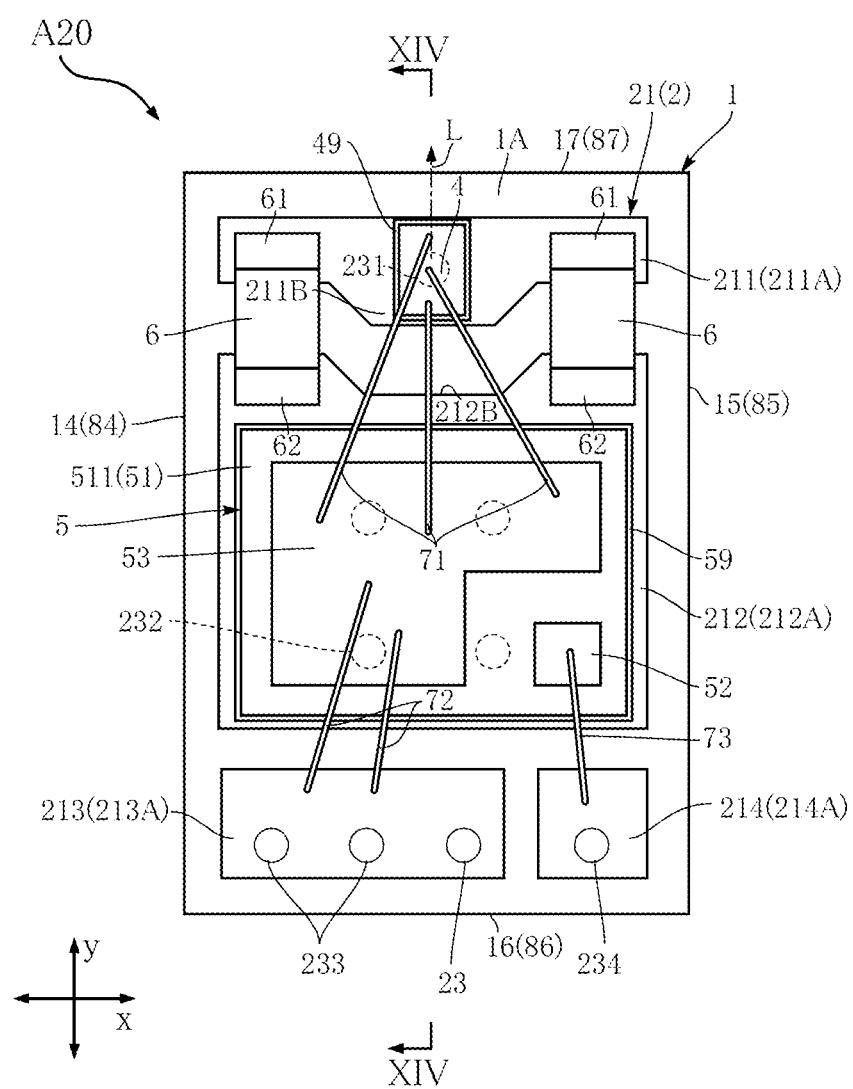
FIG. 12 is a plan view showing a semiconductor device according to a second embodiment.

As shown in FIG. 12, the semiconductor device A20 has a rectangular shape, as viewed in the z-direction. In FIG. 12, the light-transmitting resin 8 is not shown. In FIG. 12, numerals 84 to 87 in a parenthesis indicate four side faces of the light-transmitting resin 8 (resin first face, resin second face, resin third face, and resin fourth face to be subsequently described).

The base member 1 supports the semiconductor laser element 4 and the switching element 5, via the conductive member 2. The base member 1 is formed of an insulative material. The material of the base member 1 is not specifically limited but may be, for example, an epoxy resin or a glass epoxy resin. For the following description, it will be assumed that the base member 1 is formed of a ceramic. In this embodiment, the base member 1 includes a support face 1A, a bottom face 1B, a first face 14, a second face 15, a third face 16, and a fourth face 17, and has a rectangular shape, as viewed in the z-direction.

The support face 1A is oriented to one side in the z-direction, and has a flat surface, in the illustrated example. The bottom face 1B is oriented to the other side in the z-direction, opposite to the support face 1A, and has a flat surface, in the illustrated example. The first face 14 is oriented to one side in the x-direction, and has a flat surface, in the illustrated example. The second face 15 is oriented to the other side in the x-direction, opposite to the first face 14, and has a flat surface, in the illustrated example. The third face 16 is oriented to one side in the y-direction, and has a flat surface, in the illustrated example. The fourth face 17 is oriented to the other side in the y-direction, opposite to the third face 16, and has a flat surface, in the illustrated example.

The conductive member 2 constitutes an electrical conduction path to the semiconductor laser element 4 and the switching element 5. The material of the conductive member 2 is not specifically limited, but may be, for example, a metal such as copper (Cu), nickel (Ni), titanium (Ti), or gold (Au). The forming method of the conductive member 2 is not specifically limited. In the illustrated example, the conductive member 2 is formed through a plating process.

The illustrated conductive member 2 includes an obverse face portion 21, a reverse face portion 22, and a connecting portion 23.

The obverse face portion 21 is located on the support face 1A of the base member 1. The obverse face portion 21 has a thin plate shape, a thickness direction of which is oriented along the z-direction. The obverse face portion 21 includes a plurality of sections or portions in the illustrated example, namely a first obverse face portion 211, a second obverse face portion 212, a third obverse face portion 213, and a fourth obverse face portion 214.

Figure 14:
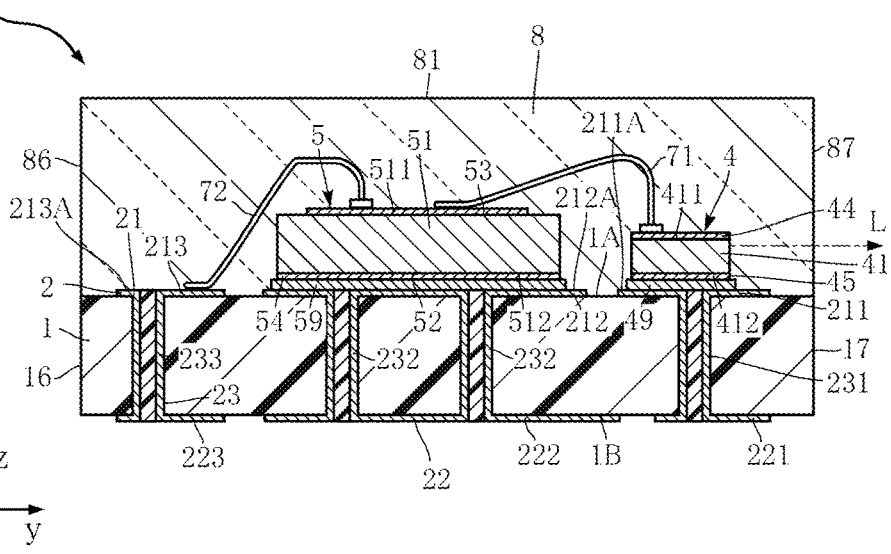
FIG. 14 is a cross-sectional view taken along a line XIV-XIV in FIG. 12.

As shown in FIG. 12 and FIG. 14, the first obverse face portion 211 is located on the side of the fourth face 17 of the base member 1, in the y-direction. The first obverse face portion 211 includes an obverse face 211A oriented to one side in the z-direction. The shape of the first obverse face portion 211 is not specifically limited but, in the illustrated example, the first obverse face portion 211 has a rectangular shape having the long sides extending in the x-direction, to which a protruding portion 211B is combined. The protruding portion 211B protrudes from the edge of the first obverse face portion 211 on the side of the third face 16 in the y-direction, toward the third face 16 in the y-direction. The protruding portion 211B is located at the center of the first obverse face portion 211, in the x-direction. The first obverse face portion 211 is spaced apart from the first face 14, the second face 15, and the fourth face 17.

As shown in FIG. 12 and FIG. 14, the second obverse face portion 212 is located on the side of the third face 16 in the y-direction, with respect to the first obverse face portion 211. The second obverse face portion 212 includes an obverse face 212A oriented to one side in the z-direction. The size of the second obverse face portion 212 in the x-direction is generally the same as that of the first obverse face portion 211. The size of the second obverse face portion 212 in the y-direction is larger than that of the first obverse face portion 211. The second obverse face portion 212 overlaps with the first obverse face portion 211, as viewed in the y-direction. The shape of the second obverse face portion 212 is not specifically limited but, in the illustrated example, the second obverse face portion 212 has a rectangular shape with a recess. The second obverse face portion 212 includes a recess 212B. The recess 212B is recessed from the edge of the second obverse face portion 212 on the side of the fourth face 17 in the y-direction, toward the third face 16 in the y-direction. The recess 212B is located at the center of the second obverse face portion 212, in the x-direction. In addition, the recess 212B overlaps with the protruding portion 211B, as viewed in the y-direction. The second obverse face portion 212 is larger in area than the first obverse face portion 211, the third obverse face portion 213, and the fourth obverse face portion 214. The second obverse face portion 212 is spaced apart from the first face 14 and the second face 15.

As shown in FIG. 12 and FIG. 14, the third obverse face portion 213 is located on the side of the third face 16 in the y-direction, with respect to the second obverse face portion 212. The third obverse face portion 213 is located on the side of the first face 14 in the x-direction on the base member 1, and on the side of the third face 16 in the y-direction. The third obverse face portion 213 includes an obverse face 213A oriented to one side in the z-direction. The shape of the third obverse face portion 213 is not specifically limited but, in the illustrated example, the third obverse face portion 213 has a rectangular shape having the long sides extending in the x-direction. The illustrated example of the third obverse face portion 213 is spaced apart from the first face 14 and the third face 16.

As shown in FIG. 12, the fourth obverse face portion 214 is located on the side of the second face 15 in the x-direction, with respect to the third obverse face portion 213, and on the side of the third face 16 in the y-direction, with respect to the second obverse face portion 212. The fourth obverse face portion 214 includes an obverse face 214A oriented to one side in the z-direction. The shape of the fourth obverse face portion 214 is not specifically limited but, in the illustrated example, the fourth obverse face portion 214 has a rectangular shape. In the illustrated example, the size of the fourth obverse face portion 214 in the y-direction is generally the same as that of the third obverse face portion 213. In addition, the size of the fourth obverse face portion 214 in the x-direction is smaller than that of the third obverse face portion 213. The fourth obverse face portion 214 is smaller in area than the third obverse face portion 213. The fourth obverse face portion 214 overlaps with the third obverse face portion 213, as viewed in the x-direction. Further, the fourth obverse face portion 214 overlaps with the first obverse face portion 211 and the second obverse face portion 212, as viewed in the y-direction. The illustrated example of the fourth obverse face portion 214 is spaced apart from the second face 15 and the third face 16.

Figure 13:
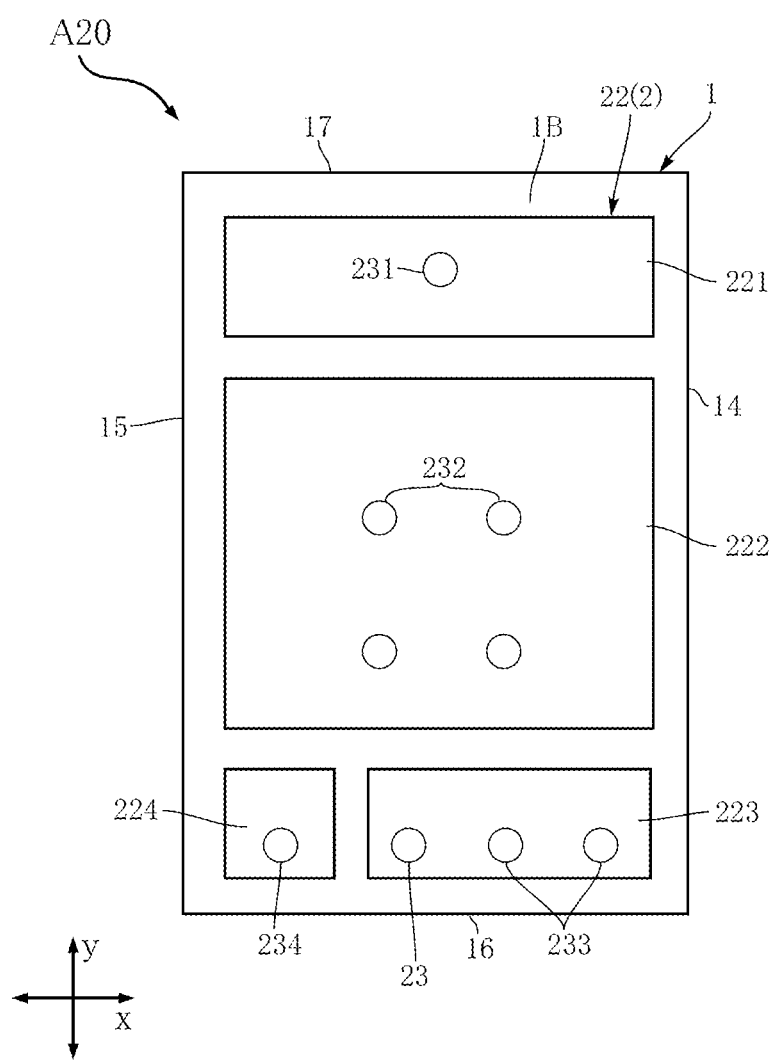
FIG. 13 is a bottom view of the semiconductor device shown in FIG. 12.

As shown in FIG. 13 and FIG. 14, the reverse face portion 22 is located on the bottom face 1B of the base member 1. In the illustrated example, the reverse face portion 22 includes a first reverse face portion 221, a second reverse face portion 222, a third reverse face portion 223, and a fourth reverse face portion 224. In this embodiment, the reverse face portion 22 is used as a mounting terminal, when the semiconductor device A20 is mounted on a circuit board (not shown).

As shown in FIG. 13 and FIG. 14, the first reverse face portion 221 is located on the side of the fourth face 17 in the y-direction, on the base member 1. The shape of the first reverse face portion 221 is not specifically limited but, in the illustrated example, the first reverse face portion 221 has a rectangular shape having the long sides extending in the x-direction. The illustrated example of the first reverse face portion 221 is spaced apart from the first face 14, the second face 15, and the fourth face 17.

As shown in FIG. 13 and FIG. 14, the second reverse face portion 222 is located on the side of the third face 16 in the y-direction, with respect to the first reverse face portion 221. The size of the first reverse face portion 221 in the x-direction is generally the same as that of the first reverse face portion 221. The size of the second reverse face portion 222 in the y-direction is larger than that of the first reverse face portion 221. The second reverse face portion 222 overlaps with the first reverse face portion 221, as viewed in the y-direction. The shape of the second reverse face portion 222 is not limited but, in the illustrated example, the second reverse face portion 222 has a rectangular shape. The second reverse face portion 222 is larger in area than the first reverse face portion 221, the third reverse face portion 223, and the fourth reverse face portion 224. The illustrated example of the second reverse face portion 222 is spaced apart from the first face 14 and the second face 15.

As shown in FIG. 13 and FIG. 14, the third reverse face portion 223 is located on the side of the third face 16 in the y-direction, with respect to the second reverse face portion 222. The third reverse face portion 223 is located on the side of the first face 14 in the x-direction on the base member 1, and on the side of the third face 16 in the y-direction. The shape of the third reverse face portion 223 is not specifically limited but, in the illustrated example, the third reverse face portion 223 has a rectangular shape having the long sides extending in the x-direction. The illustrated example of the third reverse face portion 223 is spaced apart from the first face 14 and the third face 16.

As shown in FIG. 13, the fourth reverse face portion 224 is located on the side of the second face 15 in the x-direction, with respect to the third reverse face portion 223, and on the side of the third face 16 in the y-direction, with respect to the second reverse face portion 222. The shape of the fourth reverse face portion 224 is not specifically limited but, in the illustrated example, the fourth reverse face portion 224 has a rectangular shape. In the illustrated example, the size of the fourth reverse face portion 224 in the y-direction is generally the same as that of the third reverse face portion 223. In addition, the size of the fourth reverse face portion 224 in the x-direction is smaller than that of the third reverse face portion 223. The fourth reverse face portion 224 is smaller in area than the third reverse face portion 223. The fourth reverse face portion 224 overlaps with the third reverse face portion 223, as viewed in the x-direction. Further, the fourth reverse face portion 224 overlaps with the first reverse face portion 221 and the second reverse face portion 222, as viewed in the y-direction. The illustrated example of the fourth reverse face portion 224 is spaced apart from the second face 15 and the third face 16.

The connecting portion 23 provides electrical conduction between the obverse face portion 21 and the reverse face portion 22. The configuration of the connecting portion 23 is not specifically limited. In the illustrated example, the connecting portion 23 includes a first connecting portion 231, a plurality of second connecting portions 232, a plurality of third connecting portions 233, and a fourth connecting portion 234, as shown in FIG. 12 and FIG. 13. The number of each of the first connecting portion 231, the second connecting portions 232, the third connecting portions 233, and the fourth connecting portion 234, is not specifically limited.

The configuration of the first connecting portion 231, the second connecting portion 232, the third connecting portion 233, and the fourth connecting portion 234 is not specifically limited but, in this embodiment, the connecting portions are formed so as to penetrate through the base member 1 in the thickness direction, in the inner region of the base member 1 in a z-direction view (region spaced apart from first face 14, second face 15, third face 16, and fourth face 17), as shown in FIG. 12 to FIG. 14. The first connecting portion 231, the second connecting portion 232, the third connecting portion 233, and the fourth connecting portion 234 can be obtained by forming a metal plated layer on the inner wall of through holes formed in the base member 1, so as to reach the support face 1A and the bottom face 1B. In the illustrated example, the inside of the first connecting portion 231, the second connecting portion 232, the third connecting portion 233, and the fourth connecting portion 234 is filled with a resin. However, for example a metal may be loaded in the mentioned connecting portions.

As shown in FIG. 12 to FIG. 14, the first connecting portion 231 is continuous with the first obverse face portion 211 and the first reverse face portion 221, thus connecting the first obverse face portion 211 and the first reverse face portion 221.

As shown in FIG. 12 to FIG. 14, the plurality of second connecting portions 232 are continuous with the second obverse face portion 212 and the second reverse face portion 222, thus connecting the second obverse face portion 212 and the second reverse face portion 222. In the illustrated example, the plurality of second connecting portions 232 are arranged in a matrix pattern along the x-direction and the y-direction.

As shown in FIG. 12 to FIG. 14, the plurality of third connecting portions 233 are continuous with the third obverse face portion 213 and the third reverse face portion 223, thus connecting the third obverse face portion 213 and the third reverse face portion 223. In this embodiment, the plurality of third connecting portions 233 are aligned along the x-direction. The plurality of third connecting portions 233 are located on the side of the third face 16, in the y-direction.

As shown in FIG. 12 and FIG. 13, the fourth connecting portion 234 is continuous with the fourth obverse face portion 214 and the fourth reverse face portion 224, thus connecting the fourth obverse face portion 214 and the fourth reverse face portion 224. Unlike the illustrated example, a plurality of the fourth connecting portions 234 may be provided.

The semiconductor laser element 4 is the light source of the semiconductor device A20, and includes an active layer formed of a semiconductor. In this embodiment, as shown in FIG. 14, the semiconductor laser element 4 includes an element main body 41, a first laser electrode 44, and a second laser electrode 45. The element main body 41 includes an element obverse face 411 and an element reverse face 412. The element obverse face 411 and the element reverse face 412 are oriented to the opposite sides in the z-direction. The element obverse face 411 is oriented to the same side as is the obverse face 211A, in the z-direction. The element reverse face 412 is opposed to the obverse face 211A.

The first laser electrode 44 is located on the element obverse face 411. The second laser electrode 45 is located on the element reverse face 412. In FIG. 12, the first laser electrode 44 is not shown. In this embodiment, the first laser electrode 44 serves as the anode electrode, and the second laser electrode 45 serves as the cathode electrode. The second laser electrode 45 includes silver, or a plurality of metal layers such as a nickel layer and a silver layer, stacked on each other.

As shown in FIG. 12 and FIG. 14, the semiconductor laser element 4 is located on the first obverse face portion 211, in this embodiment. To be more detailed, the second laser electrode 45 of the semiconductor laser element 4 is electrically connected to the obverse face 211A of the first obverse face portion 211, via the conductive bonding material 49. In the illustrated example, the semiconductor laser element 4 overlaps with the protruding portion 211B and the recess 212B, as viewed in the y-direction. The semiconductor laser element 4 emits a laser beam L, to the side to which the fourth face 17 is oriented, in the y-direction. In the illustrated example, the semiconductor laser element 4 overlaps with the first connecting portion 231, as viewed in the z-direction.

Figure 15:
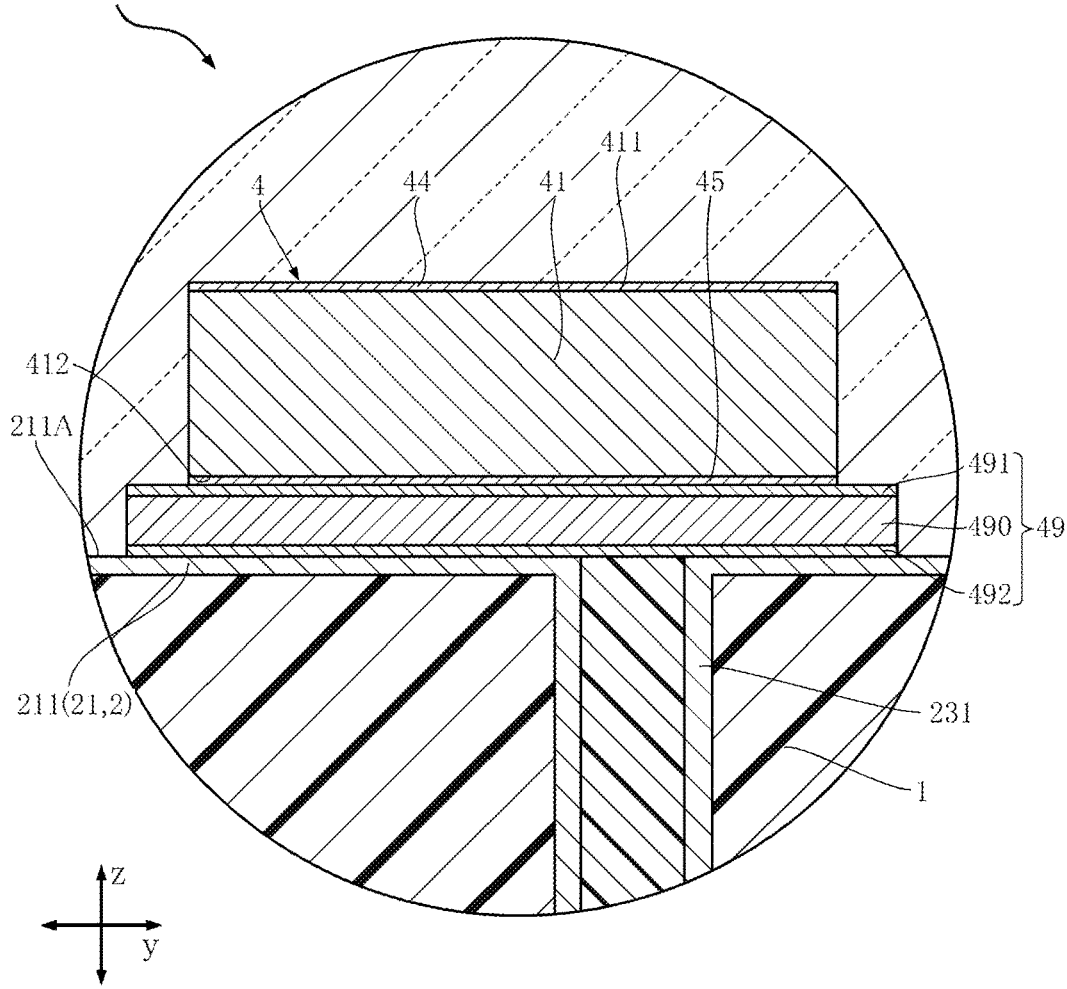
FIG. 15 is a partially enlarged cross-sectional view from FIG. 14.
Figure 16:
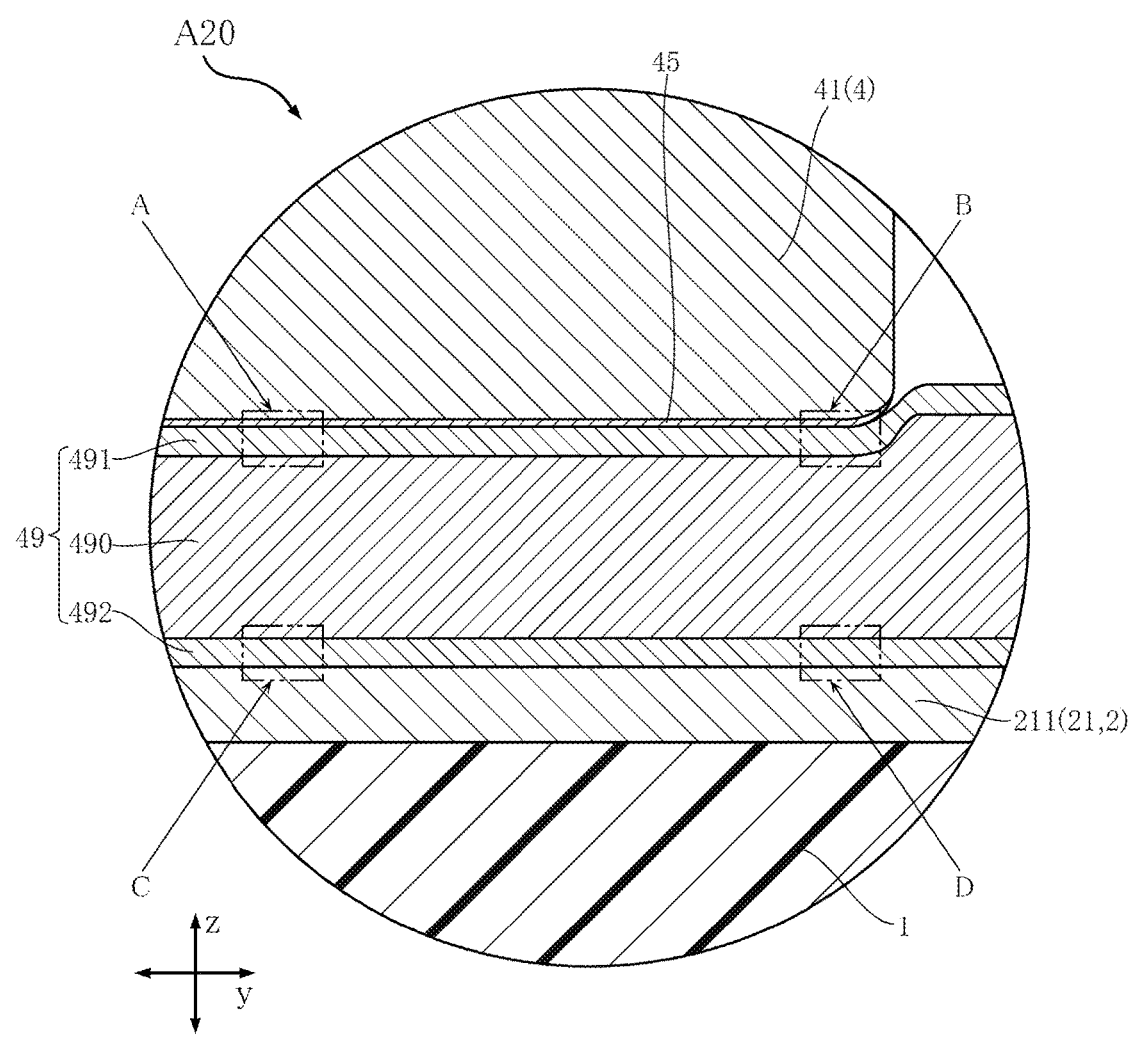
FIG. 16 is a partially enlarged cross-sectional view from FIG. 15.

The conductive bonding material 49 is disposed between the conductive member 2 (first obverse face portion 211 of obverse face portion 21) and the semiconductor laser element 4. The conductive bonding material 49 is larger in size than the semiconductor laser element 4, as viewed in the z-direction, and the entirety of the semiconductor laser element 4 overlaps with the conductive bonding material 49, as viewed in the z-direction. The conductive bonding material 49 includes a plurality of metal layers stacked on each other. As shown in FIG. 15 and FIG. 16, the conductive bonding material 49 in the semiconductor device A20 includes the metal base layer 490, the first bonding layer 491, and the second bonding layer 492. In this embodiment also, as shown in FIG. 17 to FIG. 20, the conductive bonding material 49 further includes the first intermediate layer 493 and the second intermediate layer 494.

The metal base layer 490 occupies a major part of the volume of the conductive bonding material 49. The thickness of the metal base layer 490 is, for example, approximately 10 to 200 μm. The material of the metal base layer 490 includes at least one of, for example, aluminum (Al), titanium (Ti), zinc (Zn), hafnium (Hf), and erbium (Er). In this embodiment, the material of the metal base layer 490 contains aluminum. When the metal base layer 490 is formed of aluminum, the Young's modulus of the metal base layer 490 is 70.3 GPa.

Figure 17:
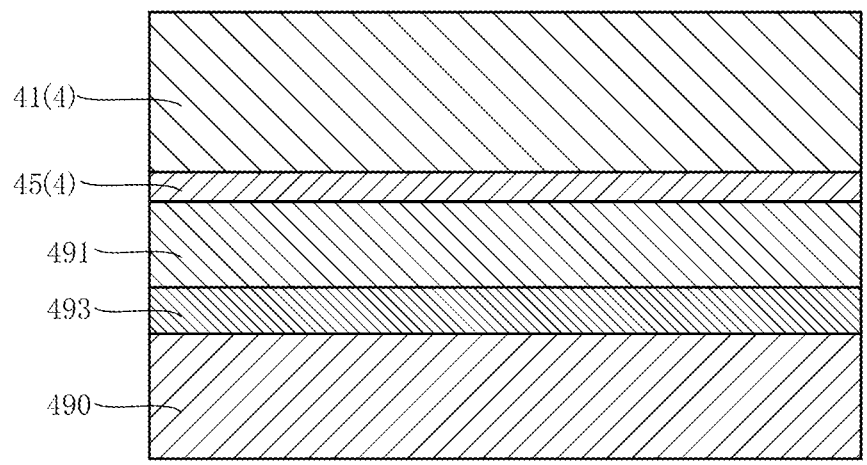
FIG. 17 is an enlarged cross-sectional view of a portion A in FIG. 16.
Figure 18:
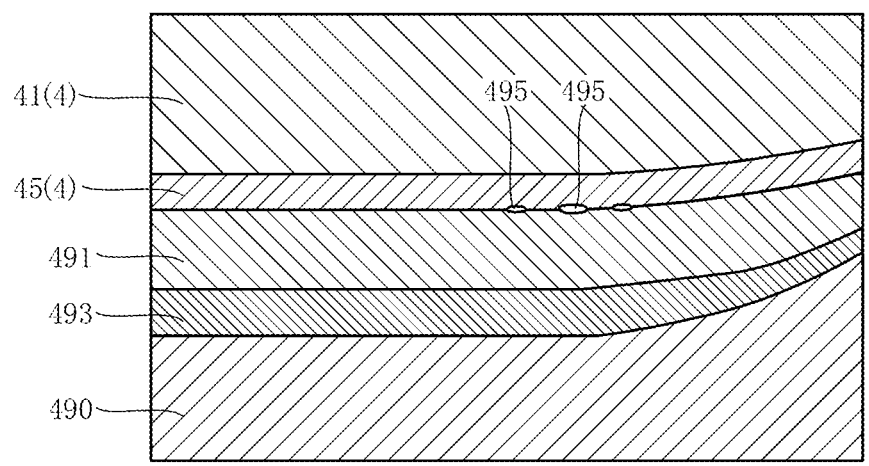
FIG. 18 is an enlarged cross-sectional view of a portion B in FIG. 16.

The first bonding layer 491 is disposed between the metal base layer 490 and the semiconductor laser element 4. In this embodiment, as shown in FIG. 17 and FIG. 18, the first bonding layer 491 is formed on the first intermediate layer 493. The material of the first bonding layer 491 includes at least one of, for example, silver, copper, and gold. In this embodiment, the material of the first bonding layer 491 contains silver. The first bonding layer 491 is bonded to the semiconductor laser element 4 (second laser electrode 45), by metal solid-phase diffusion. The material of the second laser electrode 45 contains, for example, silver. The second laser electrode 45 is thinner than the first bonding layer 491. The second laser electrode 45 is formed, for example, through a sputtering process.

Figure 19:
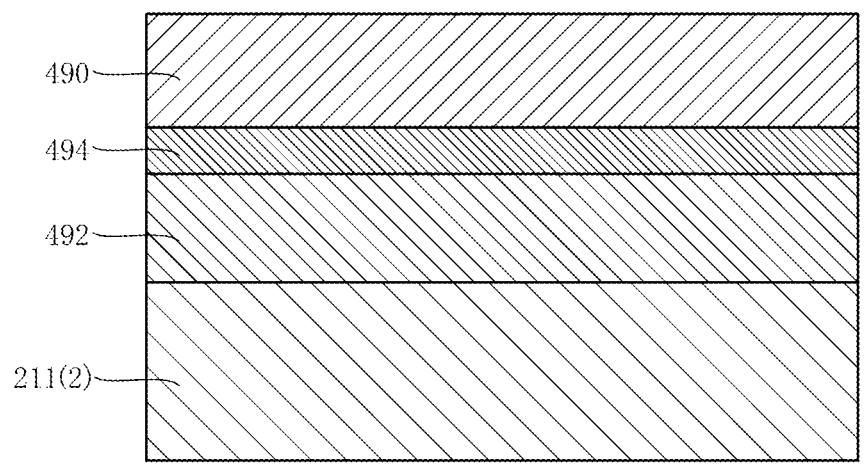
FIG. 19 is an enlarged cross-sectional view of a portion C in FIG. 16.
Figure 20:
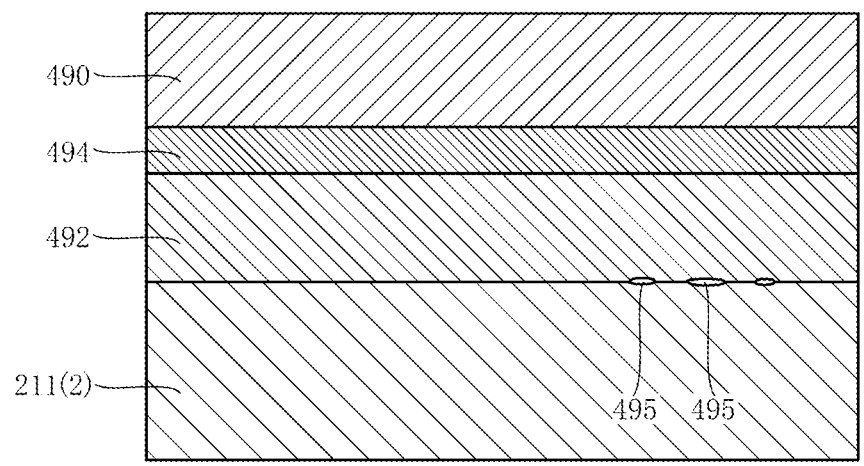
FIG. 20 is an enlarged cross-sectional view of a portion D in FIG. 16.

The second bonding layer 492 is disposed between the metal base layer 490 and the conductive member 2 (first obverse face portion 211). In this embodiment, as shown in FIG. 19 and FIG. 20, the second bonding layer 492 is formed on the second intermediate layer 494. The material of the second bonding layer 492 includes at least one of, for example, silver, copper, and gold. In this embodiment, the material of the second bonding layer 492 contains silver. The second bonding layer 492 is bonded to the conductive member 2 (first obverse face portion 211), by metal solid-phase diffusion.

When the first bonding layer 491 and the second bonding layer 492 are each formed of silver, the Young's modulus of the first bonding layer 491 and the second bonding layer 492 is 82.7 GPa. Accordingly, as is apparent from the Young's modulus of the metal base layer 490 (70.3 GPa), the Young's modulus of the metal base layer 490 is smaller than that of the first bonding layer 491 and the second bonding layer 492. The first bonding layer 491 and the second bonding layer 492 each have a thickness of, for example, approximately 2 to 5 μm, which is thinner than the metal base layer 490.

As shown in FIG. 17 and FIG. 18, the first intermediate layer 493 is disposed between the metal base layer 490 and the first bonding layer 491. In this embodiment, the first intermediate layer 493 is formed on the metal base layer 490. As shown in FIG. 19 and FIG. 20, the second intermediate layer 494 is disposed between the metal base layer 490 and the second bonding layer 492. In this embodiment, the second intermediate layer 494 is formed on the metal base layer 490. The material of each of the first intermediate layer 493 and the second intermediate layer 494 contains, for example, nickel. When the first intermediate layer 493 and the second intermediate layer 494 are each formed of nickel, the Young's modulus of each of the first intermediate layer 493 and the second intermediate layer 494 is 200 GPa. The first intermediate layer 493 and the second intermediate layer 494 each have a thickness of, for example, approximately 0.2 to 2 μm, which is thinner than the first bonding layer 491 and the second bonding layer 492.

The layered structure of the conductive bonding material 49 is, for example, formed through a sputtering process or plating process. The forming method of the conductive bonding material 49 is, for example, similar to the case of the conductive bonding material 49 of the semiconductor device A10. The method of bonding the conductive member 2 (first obverse face portion 211) and the semiconductor laser element 4 via the conductive bonding material 49 is also similar to the method employed for the semiconductor device A10, described with reference to FIG. 11.

When the conductive member 2 and the semiconductor laser element 4 are bonded to each other via the conductive bonding material 49, by solid-phase diffusion, a portion of the conductive bonding material 49 overlapping with the semiconductor laser element 4 as viewed in the z-direction is slightly recessed, owing to the pressure from the side of the semiconductor laser element 4. As a result, as shown in FIG. 16, a stepped portion is formed in the conductive bonding material 49, along the boundary between the portion overlapping with the semiconductor laser element 4 as viewed in the z-direction, and the portion not overlapping with the semiconductor laser element 4 as viewed in the z-direction.

As shown in FIG. 16, FIG. 18, and FIG. 20, in a region close to the boundary between the portions of the conductive bonding material 49 overlapping with the semiconductor laser element 4 and not overlapping therewith, as viewed in the z-direction, voids 495 may be formed in the interface between the first bonding layer 491 and the second laser electrode 45 (semiconductor laser element 4), and the interface between the second bonding layer 492 and the first obverse face portion 211 (conductive member 2). On the other hand, as shown in FIG. 16, FIG. 17, and FIG. 19, in a region slightly on the inner side of the boundary between the portions of the conductive bonding material 49 overlapping with the semiconductor laser element 4 and not overlapping therewith, as viewed in the z-direction (where conductive bonding material 49 overlaps with semiconductor laser element 4 as viewed in z-direction), the voids are not formed in the interface between the first bonding layer 491 and the second laser electrode 45 (semiconductor laser element 4), and the interface between the second bonding layer 492 and the first obverse face portion 211 (conductive member 2). As may be understood from the above, the first bonding layer 491 and the second laser electrode 45, and the second bonding layer 492 and the first obverse face portion 211, are firmly bonded by solid-phase diffusion.

The switching element 5 serves to turn on and off the current to the semiconductor laser element 4. The switching element 5 is a transistor such as a FET constituted of Si, SiC, or GaN. When the switching element 5 is formed of SiC, a high-speed switching action can be realized. The switching element 5 includes, as shown in FIG. 12 and FIG. 14, an element main body 51, a gate electrode 52, a source electrode 53, and a drain electrode 54. The element main body 51 is formed of a semiconductor material such as Si or SiC, and includes an element obverse face 511 and an element reverse face 512. The element obverse face 511 is oriented to the same side as is the obverse face 212A, in the z-direction. The element reverse face 512 is oriented to the same side as is the bottom face 1B in the z-direction, and opposed to the obverse face 212A.

The gate electrode 52 is located on the element obverse face 511. In the illustrated example, the gate electrode 52 is located on the side of the second face 15 in the x-direction, and on the side of the third face 16 in the y-direction. The shape of the gate electrode 52 is not specifically limited but, in the illustrated example, the gate electrode 52 has a rectangular shape, as viewed in the z-direction.

The source electrode 53 is located on the element obverse face 511. In the illustrated example, the source electrode 53 has an L-shape as viewed in the z-direction, and is located in a region on the side of the first face 14 in the x-direction, and in a region on the side of the fourth face 17 in the y-direction, with respect to the gate electrode 52.

The drain electrode 54 is located on the element reverse face 512 and, in the illustrated example, covers generally the entirety of the element reverse face 512.

As shown in FIG. 12 and FIG. 14, the switching element 5 is located on the second obverse face portion 212, in this embodiment. To be more detailed, the drain electrode 54 of the switching element 5 is electrically connected to the obverse face 212A of the second obverse face portion 212, via a conductive bonding material 59. In this embodiment, the switching element 5 located on the side of the first face 14 in the x-direction, on the second obverse face portion 212. The switching element 5 overlaps with all of the plurality of second connecting portions 232, as viewed in the z-direction. The switching element 5 overlaps with the semiconductor laser element 4, as viewed in the y-direction.

The conductive bonding material 59 is disposed between the conductive member 2 (second obverse face portion 212 of obverse face portion 21) and the switching element 5. The conductive bonding material 59 is larger in size than the switching element 5 as viewed in the z-direction, and the entirety of the switching element 5 overlaps with the conductive bonding material 59, as viewed in the z-direction. The conductive bonding material 59 includes a plurality of metal layers stacked on each other. The conductive bonding material 59 includes, like the conductive bonding material 49, a metal base layer, a first bonding layer, a second bonding layer, a first intermediate layer, and a second intermediate layer. The configuration of the metal base layer, the first bonding layer, the second bonding layer, the first intermediate layer, and the second intermediate layer is similar to that of the metal base layer 490, the first bonding layer 491, the second bonding layer 492, the first intermediate layer 493, and the second intermediate layer 494 of the conductive bonding material 49, respectively. The first bonding layer of the conductive bonding material 59 is bonded to the switching element 5 (drain electrode 54), by metal solid-phase diffusion, and the second bonding layer of the conductive bonding material 59 is bonded to the conductive member 2 (second obverse face portion 212), by metal solid-phase diffusion. The forming method of the conductive bonding material 59 is, for example, similar to that of the conductive bonding material 49 of the semiconductor device A10. The method of bonding the conductive member 2 (second obverse face portion 212) and the switching element 5 via the conductive bonding material 59 is also similar to the method employed for the semiconductor device A10, described with reference to FIG. 11.

The capacitor 6 serves to temporarily accumulate an electric charge to constitute the current supplied to the semiconductor laser element 4. In the illustrated example, as shown in FIG. 12, the capacitor 6 includes an electrode 61 and an electrode 62. The electrode 61 is conductively bonded to the first obverse face portion 211, via a bonding material (not shown). The electrode 62 is conductively bonded to the second obverse face portion 212, via a bonding material (not shown). For example, the bonding material is solder. In this embodiment, the semiconductor device A20 includes two capacitors 6. The two capacitors 6 are connected in parallel to each other. In this embodiment, in addition, the two capacitors 6 are located on the respective sides of the semiconductor laser element 4, in the x-direction. The two capacitors 6 are deviated from the recess 212B and the protruding portion 211B, as viewed in the y-direction.

The plurality of first wires 71 are connected between the source electrode 53 of the switching element 5 and the first laser electrode 44 of the semiconductor laser element 4, as shown in FIG. 12 and FIG. 14. The first wire 71 may be formed of a metal such as Au, Cu, or Al, and Au is employed in this embodiment. The number of the plurality of first wires 71 is not specifically limited but, in the illustrated example, three first wires 71 are provided. The plurality of first wires 71 are connected to positions on the source electrode 53 on the side of the fourth face 17, in the y-direction. The plurality of first wires 71 are connected to the first laser electrode 44 of the semiconductor laser element 4, at positions aligned in the y-direction.

The plurality of second wires 72 are, as shown in FIG. 12 and FIG. 14, connected between the source electrode 53 of the switching element 5 and the third obverse face portion 213 of the obverse face portion 21 of the conductive member 2. The second wire 72 may be formed of a metal such as Au, Cu, or Al, and Au is employed in this embodiment, like the first wire 71. The number of the plurality of second wires 72 is not specifically limited but, in the illustrated example, two second wires 72 are provided, which is fewer than the number of the plurality of first wires 71. Accordingly, the resistance of the plurality of first wire 71 is lower than that of the plurality of second wire 72. The plurality of second wires 72 are connected to positions on the source electrode 53 on the side of the third face 16, in the y-direction. The plurality of second wires 72 are connected to the third obverse face portion 213, at positions aligned in the x-direction.

The third wire 73 is connected between the gate electrode 52 of the switching element 5 and the fourth obverse face portion 214 of the obverse face portion 21 of the conductive member 2, as shown in FIG. 12. The third wire 73 may be formed of a metal such as Au, Cu, or Al, and Au is employed in this embodiment. The number of the third wire 73 is not specifically limited but, in the illustrated example, a single third wire 73 is provided.

The light-transmitting resin 8 is provided on the support face 1A of the base member 1, so as to cover the support face 1A, the semiconductor laser element 4, the switching element 5, the plurality of capacitors 6, the plurality of first wires 71, the plurality of second wires 72, and the third wire 73. The light-transmitting resin 8 is formed of a material that transmits the laser beam L from the semiconductor laser element 4, such as a transparent epoxy resin or silicone resin.

The shape of the light-transmitting resin 8 is not specifically limited. In this embodiment, as shown in FIG. 12 and FIG. 14, the light-transmitting resin 8 includes a resin obverse face 81, a resin first face 84, a resin second face 85, a resin third face 86, and a resin fourth face 87.

The resin obverse face 81 is oriented to the same side as is the support face 1A, in the z-direction and, in the illustrated example, has a flat surface. The resin first face 84 is oriented to the same side as is the first face 14, in the x-direction. In the illustrated example, the resin first face 84 has a flat surface, and is flush with the first face 14. The resin second face 85 is oriented to the same side as is the second face 15, in the x-direction. In the illustrated example, the resin second face 85 has a flat surface, and is flush with the second face 15. The resin third face 86 is oriented to the same side as is the third face 16, in the y-direction. In the illustrated example, the resin third face 86 has a flat surface, and is flush with the third face 16. The resin fourth face 87 is oriented to the same side as is the fourth face 17, in the y-direction. In the illustrated example, the resin fourth face 87 has a flat surface, and is flush with the resin fourth face 87. In this embodiment, the laser beam L from the semiconductor laser element 4 is emitted through the resin fourth face 87 of the light-transmitting resin 8. Here, making the surface of the resin fourth face 87 flat and smooth prevents the laser beam L from scattering, thereby improving the emission efficiency.

The semiconductor device A20 provides the following advantageous effects.

In the semiconductor device A20, the conductive bonding material 49 disposed between the conductive member 2 and the semiconductor laser element 4 includes the metal base layer 490, the first bonding layer 491, and the second bonding layer 492. The first bonding layer 491 and the semiconductor laser element 4 (second laser electrode 45), and also the second bonding layer 492 and the conductive member 2 (first obverse face portion 211) are conductively bonded to each other by metal solid-phase diffusion, and the metal base layer 490 is disposed between the first bonding layer 491 and the second bonding layer 492. With such a configuration, the metal base layer 490 serves as a cushion, when the first bonding layer 491 and the semiconductor laser element 4 (second laser electrode 45), and also the second bonding layer 492 and the conductive member 2 (first obverse face portion 211) are bonded to each other by solid-phase diffusion. Therefore, the pressure imposed on the interface between the first bonding layer 491 and the semiconductor laser element 4 (second laser electrode 45), and the interface between the second bonding layer 492 and the conductive member 2 (first obverse face portion 211), can be levelled off. Therefore, the first bonding layer 491 and the semiconductor laser element 4 (second laser electrode 45), and also the second bonding layer 492 and the conductive member 2 (first obverse face portion 211), can be firmly bonded to each other, by solid-phase diffusion bonding. As a result, the bonding status provided by the conductive bonding material 49 can be prevented from changing, despite the conductive bonding material 49 being repeatedly exposed to a high temperature, owing to the heat generated in the semiconductor laser element 4, when the semiconductor device A20 is in use. Consequently, the semiconductor device A20 including the conductive bonding material 49 improves the reliability in terms of the bonding status between the semiconductor laser element 4 and the conductive member 2.

In this embodiment, the Young's modulus of the metal base layer 490 is smaller than that of the material of each of the first bonding layer 491 and the second bonding layer 492. Accordingly, when the conductive bonding material 49 is bonded to the semiconductor laser element 4 (second laser electrode 45) and the conductive member 2 (first obverse face portion 211) by solid-phase diffusion, the stress is mitigated by the metal base layer 490, which is relatively softer, and therefore the bonding interface can be smoothed. As result, the first bonding layer 491 and the semiconductor laser element 4 (second laser electrode 45), and the second bonding layer 492 and the conductive member 2 (first obverse face portion 211), can be bonded with increased strength, by solid-phase diffusion.

In this embodiment, the metal base layer 490 is thicker than the first bonding layer 491 and the second bonding layer 492. Accordingly, when the solid-phase diffusion bonding is performed, the pressure imposed on the interface between the first bonding layer 491 and the semiconductor laser element 4 (second laser electrode 45), and the interface between the second bonding layer 492 and the conductive member 2 (first obverse face portion 211) can be more effectively levelled off. Consequently, the first bonding layer 491 and the semiconductor laser element 4 (second laser electrode 45), and the second bonding layer 492 and the conductive member 2 (first obverse face portion 211), can be conductively bonded to each other, with further increased bonding strength.

The conductive bonding material 49 includes the first intermediate layer 493 and the second intermediate layer 494. The first intermediate layer 493 is disposed between the metal base layer 490 and the first bonding layer 491, and the second intermediate layer 494 is disposed between the metal base layer 490 and the second bonding layer 492. The presence of the first intermediate layer 493 and the second intermediate layer 494 is advantageous in levelling off the pressure imposed on the interface between the first bonding layer 491 and the semiconductor laser element 4 (second laser electrode 45), and the interface between the second bonding layer 492 and the conductive member 2 (first obverse face portion 211), when the solid-phase diffusion bonding is performed. In addition, since the first intermediate layer 493 and the second intermediate layer 494 are each formed of nickel, the Young's modulus of the first intermediate layer 493 and the second intermediate layer 494 is relatively large. In this case, the pressure imposed on the bonding interface, during the solid-phase diffusion bonding process, can be made more even, and consequently the first bonding layer 491 and the semiconductor laser element 4 (second laser electrode 45), and the second bonding layer 492 and the conductive member 2 (first obverse face portion 211), can be conductively bonded to each other, with further increased bonding strength.

In this embodiment, the first bonding layer 491 and the second bonding layer 492 each contain silver. With such a configuration, the first bonding layer 491 and the second bonding layer 492 are prevented from being oxidized when the solid-phase diffusion bonding is performed using the conductive bonding material 49, and therefore the quality of the solid-phase diffusion bonding can be improved.

The conductive bonding material 59 disposed between the conductive member 2 and the switching element 5 includes, like the conductive bonding material 49, the metal base layer, the first bonding layer, the second bonding layer, the first intermediate layer, and the second intermediate layer. The configuration of the metal base layer, the first bonding layer, the second bonding layer, the first intermediate layer, and the second intermediate layer is similar to that of the metal base layer 490, the first bonding layer 491, the second bonding layer 492, the first intermediate layer 493, and the second intermediate layer 494 of the conductive bonding material 49, respectively. Therefore, the conductive bonding material 59 also contributes to improving the reliability on the bonding status between the switching element 5 and the conductive member 20. By providing the conductive bonding material 59, the similar advantageous effects to those provided by the conductive bonding material 49 can be attained.

Referring now to FIG. 21 to FIG. 28, a semiconductor device A30 according to a third embodiment will be described hereunder. The semiconductor device A30 illustrated in the mentioned drawings includes the base member 1, a barrier portion 18, the conductive member 2, an LED element 400, a wire 7 and a light-transmitting resin 8. The semiconductor device A30 can be utilized as a light source for various illumination devices and display devices.

Figure 21:
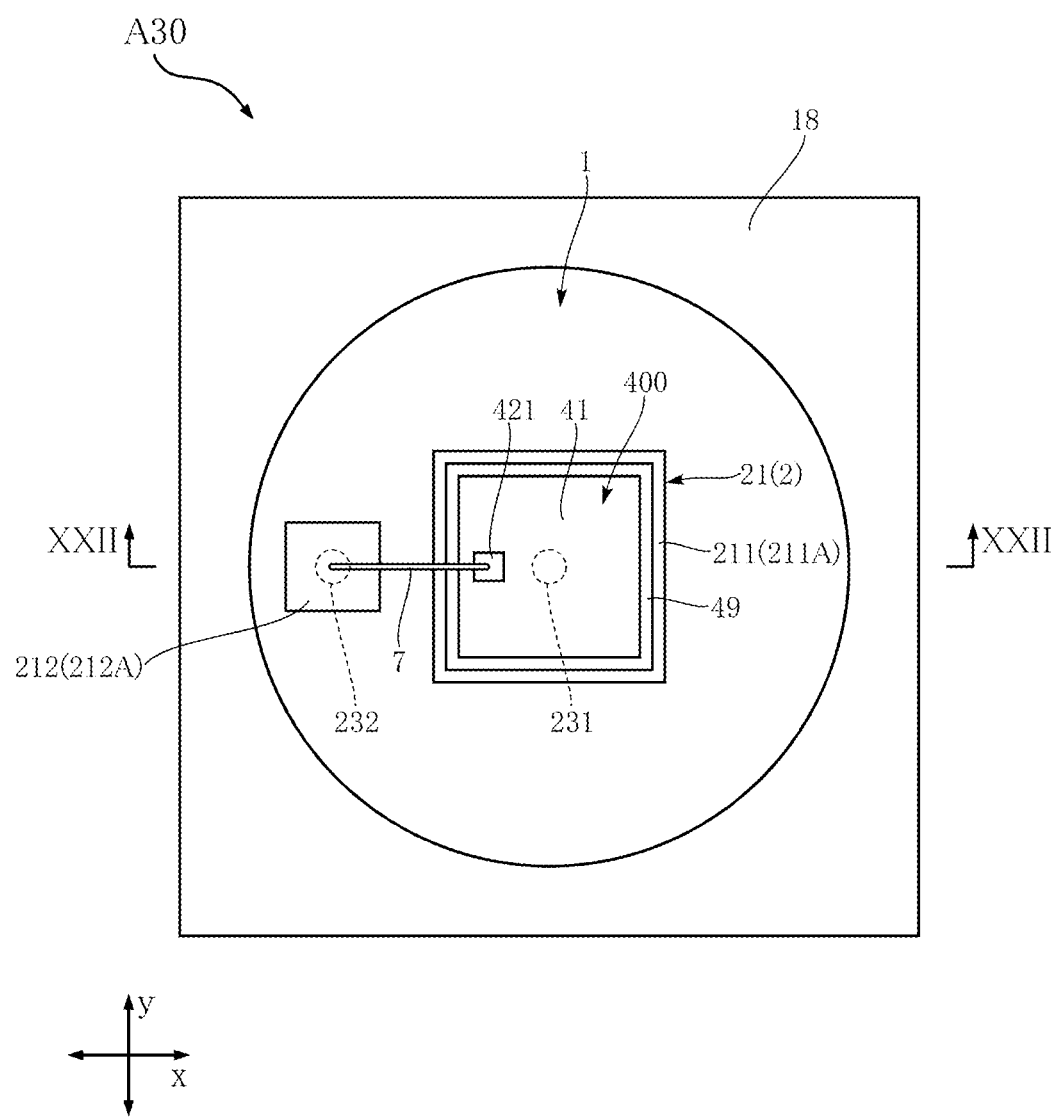
FIG. 21 is a plan view showing a semiconductor device according to a third embodiment.

As shown in FIG. 21, the semiconductor device A30 has a rectangular shape, as viewed in the z-direction. The x-direction and the y-direction respectively correspond to the pairs of parallel sides forming the rectangular shape of the semiconductor device A30. In FIG. 21, the light-transmitting resin 8 is not shown.

The base member 1 supports the LED element 400, via the conductive member 2. The base member 1 is formed of an insulative material. The material of the base member 1 is not specifically limited but may be, for example, an epoxy resin or a glass epoxy resin. For the following description, it will be assumed that the base member 1 is formed of a ceramic. In this embodiment, the base member 1 includes the support face 1A, and the bottom face 1B, and has a rectangular shape, as viewed in the z-direction.

The support face 1A is oriented to one side in the z-direction, and has a flat surface, in the illustrated example. The bottom face 1B is oriented to the other side in the z-direction, opposite to the support face 1A, and has a flat surface, in the illustrated example.

The conductive member 2 constitutes an electrical conduction path to the LED element 400. The material of the conductive member 2 is not specifically limited, but may be, for example, a metal such as copper (Cu), nickel (Ni), titanium (Ti), or gold (Au). The forming method of the conductive member 2 is not specifically limited. In the illustrated example, the conductive member 2 is formed through a plating process.

The illustrated example of the conductive member 2 includes the obverse face portion 21, the reverse face portion 22, and the connecting portion 23.

The obverse face portion 21 is located on the support face 1A of the base member 1. The obverse face portion 21 has a thin plate shape, a thickness direction of which is oriented along the z-direction. In the illustrated example, the obverse face portion 21 includes the first obverse face portion 211 and the second obverse face portion 212.

Figure 22:
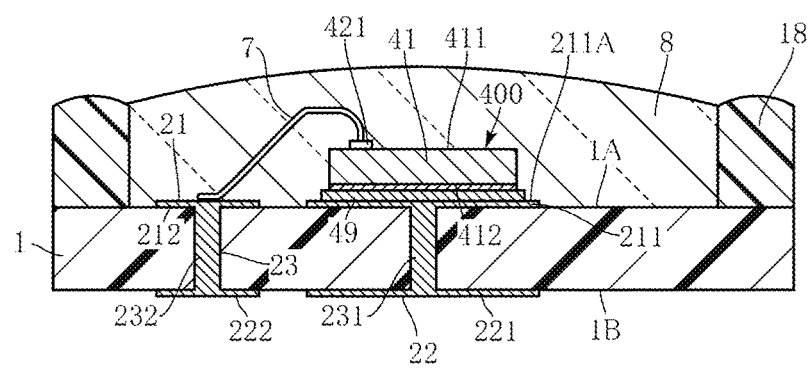
FIG. 22 is a cross-sectional view taken along a line XXII-XXII in FIG. 21.
Figure 23:
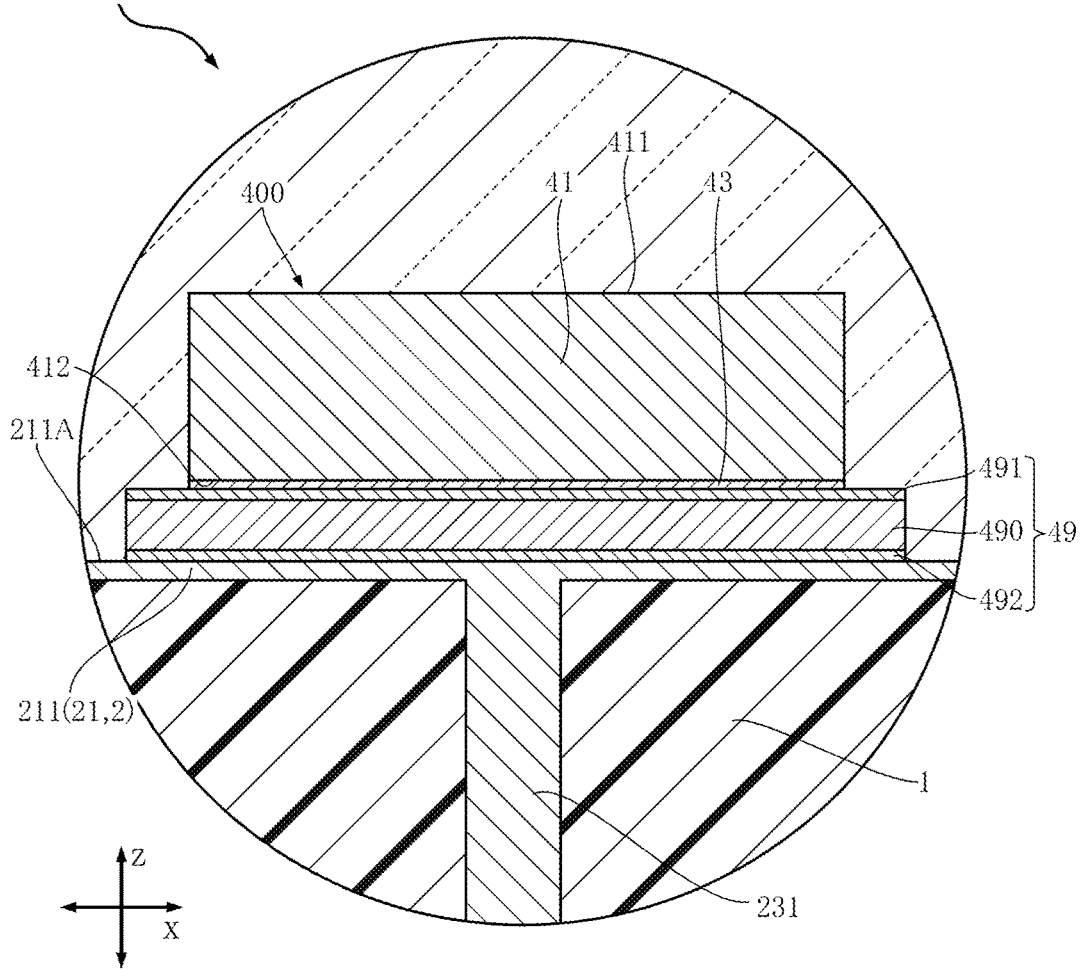
FIG. 23 is a partially enlarged cross-sectional view from FIG. 22.

As shown in FIG. 21 and FIG. 22, the first obverse face portion 211 is located at the center of the base member 1 in the z-direction. The first obverse face portion 211 includes the obverse face 211A, oriented to one side in the z-direction. The shape of the first obverse face portion 211 is not specifically limited but, in the illustrated example, the first obverse face portion 211 has a rectangular shape.

As shown in FIG. 21 and FIG. 22, the second obverse face portion 212 is located on one side in the x-direction, with respect to the first obverse face portion 211. The shape of the second obverse face portion 212 is not specifically limited but, in the illustrated example, the second obverse face portion 212 has a rectangular shape. The second obverse face portion 212 is smaller in area than the first obverse face portion 211.

As shown in FIG. 22, the reverse face portion 22 is located on the bottom face 1B of the base member 1. In the illustrated example, the reverse face portion 22 includes the first reverse face portion 221 and the second reverse face portion 222. In this embodiment, the reverse face portion 22 is used as a mounting terminal, when the semiconductor device A30 is mounted on a circuit board (not shown).

As shown in FIG. 22, the first reverse face portion 221 is located at the center of the base member 1, in the z-direction. The shape of the first reverse face portion 221 is not specifically limited but, in this embodiment, the first reverse face portion 221 has a rectangular shape.

As shown in FIG. 22, the second reverse face portion 222 is located on one side in the x-direction, with respect to the first reverse face portion 221. The shape of the second reverse face portion 222 is not limited but, in this embodiment, the second reverse face portion 222 has a rectangular shape. The second reverse face portion 222 is smaller in area than the first reverse face portion 221.

The connecting portion 23 provides electrical conduction between the obverse face portion 21 and the reverse face portion 22. The configuration of the connecting portion 23 is not specifically limited but, in the illustrated example, the connecting portion 23 includes the first connecting portion 231 and the second connecting portion 232, as shown in FIG. 21 and FIG. 22. Although a single first connecting portion 231 is provided in the illustrated example, the number of the first connecting portion 231 is not specifically limited.

The configuration of the first connecting portion 231 and the second connecting portion 232 is not specifically limited but, in this embodiment, the connecting portions are formed so as to penetrate through the base member 1 in the thickness direction, in the inner region of the base member 1 in a z-direction view, as shown in FIG. 21 and FIG. 22. The first connecting portion 231 and the second connecting portion 232 can be formed by loading a metal in through holes formed in the base member 1, so as to reach the support face 1A and the bottom face 1B. Unlike the illustrated example, the first connecting portion 231 and the second connecting portion 232 may be provided by forming a metal plated layer on the inner wall of the through holes formed in the base member 1, in which case a resin is loaded inside the first connecting portion 231 and the second connecting portion 232.

As shown in FIG. 22, the first connecting portion 231 is continuous with the first obverse face portion 211 and the first reverse face portion 221, thus connecting the first obverse face portion 211 and the first reverse face portion 221. The second connecting portion 232 is continuous with the second obverse face portion 212 and the second reverse face portion 222, thus connecting the second obverse face portion 212 and the second reverse face portion 222.

The LED element 400 serves as a light source of the semiconductor device A30, and includes an active layer formed of a semiconductor layer. In this embodiment, as shown in FIG. 22, the LED element 400 includes the element main body 41, an electrode pad 421 and the reverse face electrode 43. The element main body 41 is, for example, formed of a GaN-based semiconductor, and emits, for example, blue light. The element main body 41 includes the element obverse face 411 and the element reverse face 412. The element obverse face 411 and the element reverse face 412 are oriented to the opposite sides in the z-direction. The element obverse face 411 is oriented to the same side as is the obverse face 211A, in the z-direction. The element reverse face 412 is oriented to the same side as is the bottom face 1B, and opposed to the obverse face 211A.

The electrode pad 421 is located on the element obverse face 411. The reverse face electrode 43 is located on the element reverse face 412. In this embodiment, the electrode pad 421 serves as the anode electrode, and the reverse face electrode 43 serves as the cathode electrode. The reverse face electrode 43 is, for example, formed of silver.

As shown in FIG. 21 and FIG. 22, the LED element 400 is located on the first obverse face portion 211, in this embodiment. To be more detailed, the reverse face electrode 43 of the LED element 400 is electrically connected to the obverse face 211A of the first obverse face portion 211, via the conductive bonding material 49. The light outputted from the element main body 41 in the LED element 400 is emitted to the side to which the element obverse face 411 is oriented (one side in the z-direction). In the illustrated example, the LED element 400 overlaps with the first connecting portion 231, as viewed in the z-direction.

The conductive bonding material 49 is disposed between the conductive member 2 (first obverse face portion 211 of obverse face portion 21) and the LED element 400. The conductive bonding material 49 is larger in size than the LED element 400 as viewed in the z-direction, and the entirety of the LED element 400 overlaps with the conductive bonding material 49, as viewed in the z-direction. The conductive bonding material 49 includes a plurality of metal layers stacked on each other. As shown in FIG. and FIG. 24, the conductive bonding material 49 in the semiconductor device A30 includes the metal base layer 490, the first bonding layer 491, and the second bonding layer 492. As shown in FIG. 25 to FIG. 28, the conductive bonding material 49 further includes the first intermediate layer 493 and the second intermediate layer 494.

The metal base layer 490 occupies a major part of the volume of the conductive bonding material 49. The thickness of the metal base layer 490 is, for example, approximately 10 to 200 μm. The material of the metal base layer 490 includes at least one of, for example, aluminum (Al), titanium (Ti), zinc (Zn), hafnium (Hf), and erbium (Er). In this embodiment, the material of the metal base layer 490 contains aluminum. When the metal base layer 490 is formed of aluminum, the Young's modulus of the metal base layer 490 is 70.3 GPa.

Figure 25:
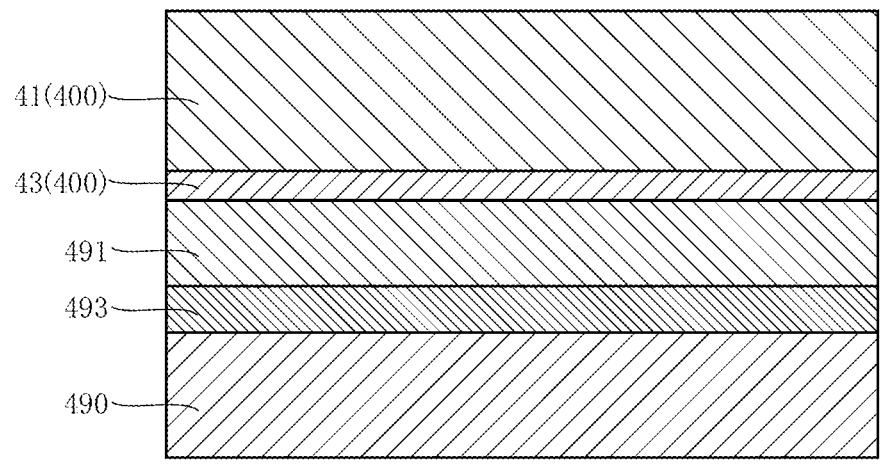
FIG. 25 is an enlarged cross-sectional view of a portion A in FIG. 24.
Figure 26:
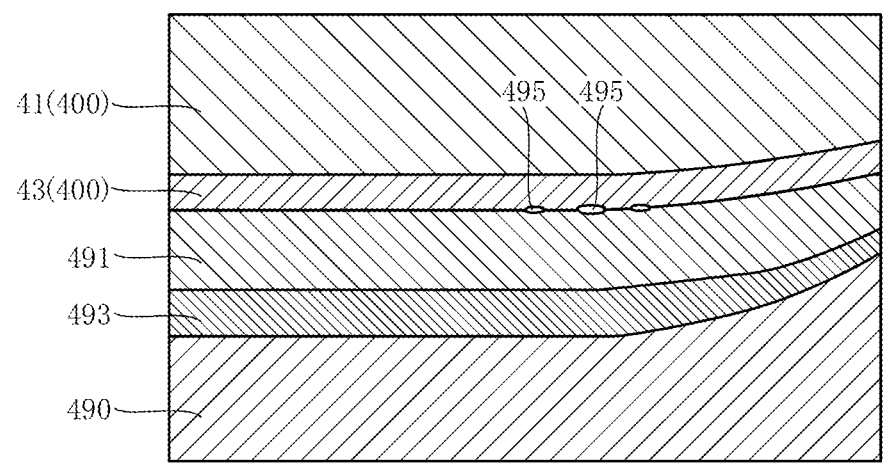
FIG. 26 is an enlarged cross-sectional view of a portion B in FIG. 24.

The first bonding layer 491 is disposed between the metal base layer 490 and the LED element 400. In this embodiment, as shown in FIG. 25 and FIG. 26, the first bonding layer 491 is formed on the first intermediate layer 493. The material of the first bonding layer 491 includes at least one of, for example, silver, copper, and gold. In this embodiment, the material of the first bonding layer 491 contains silver. The first bonding layer 491 is bonded to the LED element 400 (reverse face electrode 43), by metal solid-phase diffusion. The material of the reverse face electrode 43 contains, for example, silver. The reverse face electrode 43 is thinner than the first bonding layer 491. The reverse face electrode 43 is formed, for example, through a sputtering process.

Figure 27:
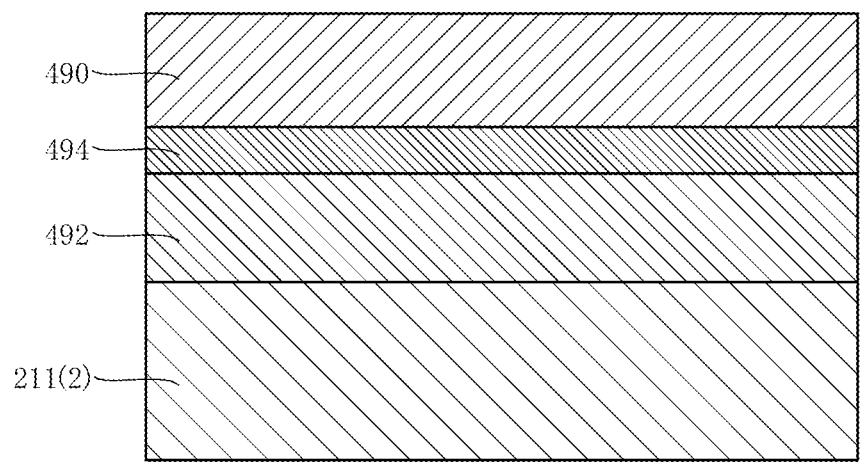
FIG. 27 is an enlarged cross-sectional view of a portion C in FIG. 24.
Figure 28:
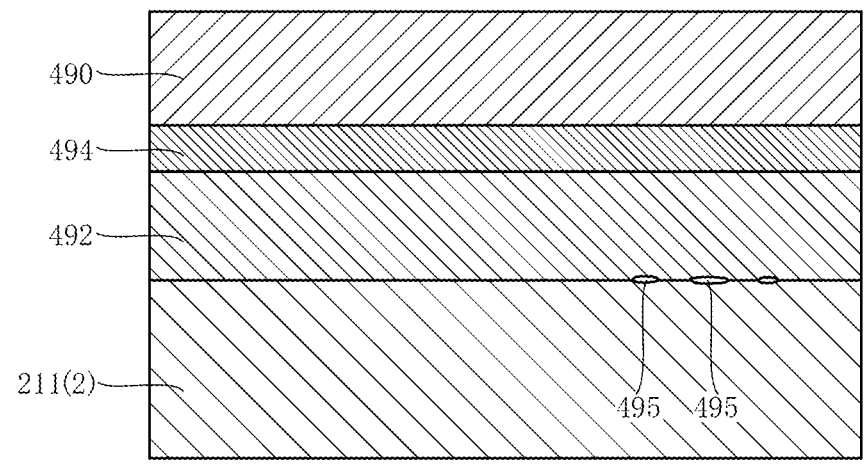
FIG. 28 is an enlarged cross-sectional view of a portion D in FIG. 24.

The second bonding layer 492 is disposed between the metal base layer 490 and the conductive member 2 (first obverse face portion 211). In this embodiment, as shown in FIG. 27 and FIG. 28, the second bonding layer 492 is formed on the second intermediate layer 494. The material of the second bonding layer 492 includes at least one of, for example, silver, copper, and gold. In this embodiment, the material of the second bonding layer 492 contains silver. The second bonding layer 492 is bonded to the conductive member 2 (first obverse face portion 211), by metal solid-phase diffusion.

When the first bonding layer 491 and the second bonding layer 492 are each formed of silver, the Young's modulus of the first bonding layer 491 and the second bonding layer 492 is 82.7 GPa. Accordingly, as is apparent from the Young's modulus of the metal base layer 490 (70.3 GPa), the Young's modulus of the metal base layer 490 is smaller than that of the first bonding layer 491 and the second bonding layer 492. The first bonding layer 491 and the second bonding layer 492 each have a thickness of, for example, approximately 2 to 5 μm, which is thinner than the metal base layer 490.

As shown in FIG. 25 and FIG. 26, the first intermediate layer 493 is disposed between the metal base layer 490 and the first bonding layer 491. In this embodiment, the first intermediate layer 493 is formed on the metal base layer 490. As shown in FIG. 27 and FIG. 28, the second intermediate layer 494 is disposed between the metal base layer 490 and the second bonding layer 492. In this embodiment, the second intermediate layer 494 is formed on the metal base layer 490. The material of each of the first intermediate layer 493 and the second intermediate layer 494 contains, for example, nickel. When the first intermediate layer 493 and the second intermediate layer 494 are each formed of nickel, the Young's modulus of each of the first intermediate layer 493 and the second intermediate layer 494 is 200 GPa. The first intermediate layer 493 and the second intermediate layer 494 each have a thickness of, for example, approximately 0.2 to 2 μm, which is thinner than the first bonding layer 491 and the second bonding layer 492.

The layered structure of the conductive bonding material 49 is, for example, formed through a sputtering process or plating process. The forming method of the conductive bonding material 49 is, for example, similar to the case of the conductive bonding material 49 of the semiconductor device A10. The method of bonding the conductive member 2 (first obverse face portion 211) and the LED element 400 via the conductive bonding material 49 is also similar to the method employed for the semiconductor device A10, described with reference to FIG. 11.

When the conductive member 2 and the LED element 400 are bonded to each other via the conductive bonding material 49, by solid-phase diffusion, a portion of the conductive bonding material 49 overlapping with the LED element 400 as viewed in the z-direction is slightly recessed, owing to the pressure from the side of the LED element 400. As result, as shown in FIG. 24, a stepped portion is formed in the conductive bonding material 49, along the boundary between the portion overlapping with the LED element 400 as viewed in the z-direction, and the portion not overlapping with the LED element 400 as viewed in the z-direction.

Figure 24:
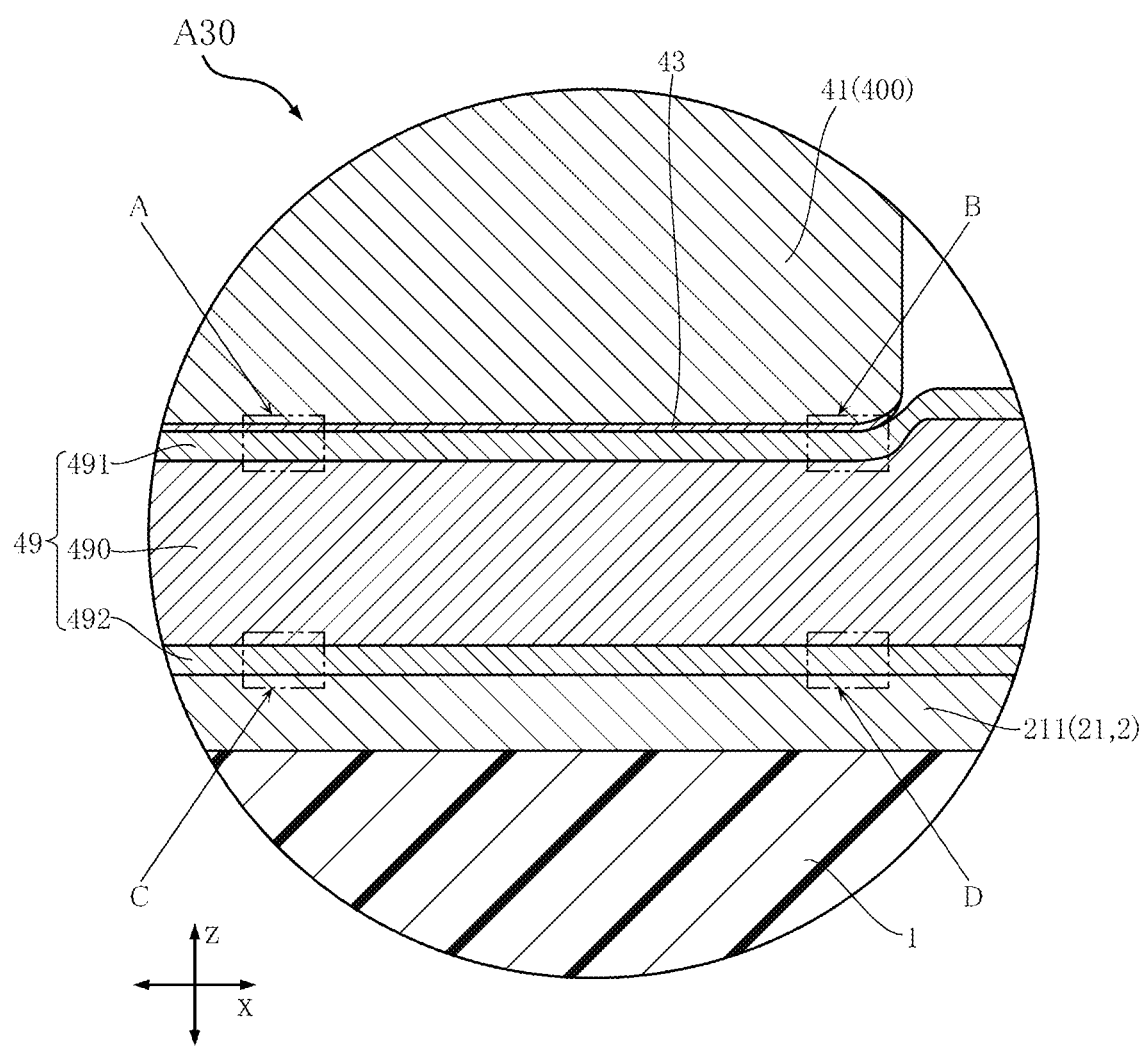
FIG. 24 is a partially enlarged cross-sectional view from FIG. 23.

As shown in FIG. 24, FIG. 26, and FIG. 28, in a region close to the boundary between the portions of the conductive bonding material 49 overlapping with the LED element 400 and not overlapping therewith, as viewed in the z-direction, voids 495 may be formed in the interface between the first bonding layer 491 and the reverse face electrode 43 (LED element 400), and the interface between the second bonding layer 492 and the first obverse face portion 211 (conductive member 2). On the other hand, as shown in FIG. 24, FIG. 25, and FIG. 27, in a region slightly on the inner side of the boundary between the portions of the conductive bonding material 49 overlapping with the LED element 400 and not overlapping therewith, as viewed in the z-direction (where conductive bonding material 49 overlaps with LED element 400 as viewed in z-direction), the voids are not formed in the interface between the first bonding layer 491 and the reverse face electrode 43 (LED element 400), and the interface between the second bonding layer 492 and the first obverse face portion 211 (conductive member 2). As may be understood from the above, the first bonding layer 491 and the reverse face electrode 43, and the second bonding layer 492 and the first obverse face portion 211, are firmly bonded by solid-phase diffusion.

The wire 7 is, as shown in FIG. 21 and FIG. 22, connected between the electrode pad 421 of the LED element 400 and the second obverse face portion 212 of the conductive member 2. The wire 7 may be formed of, for example, a metal such as Au, Cu, or Al and, in this embodiment, Au is employed.

The barrier portion 18 is located on the support face 1A of the base member 1. The barrier portion 18 is formed in a closed frame shape as viewed in the z-direction, having a rectangular outer periphery and a circular inner edge. The barrier portion 18 surrounds the LED element 400 and the light-transmitting resin 8, as viewed in the z-direction. The barrier portion 18 is, for example, formed of a white silicone resin.

The light-transmitting resin 8 is loaded in the space surrounded by the barrier portion 18, so as to cover a part of the support face 1A of the base member 1, the LED element 400, and the wire 7. The light-transmitting resin 8 is formed of a material that transmits the light from the LED element 400, such as a transparent silicone resin or epoxy resin, in which a fluorescent material is mixed. For example, a fluorescent material that emits yellow light, by being excited by blue light from the LED element 400, may be employed. In this case, white light is emitted from the semiconductor device A30.

The semiconductor device A30 provides the following advantageous effects.

In the semiconductor device A30, the conductive bonding material 49 disposed between the conductive member 2 and the LED element 400 includes the metal base layer 490, the first bonding layer 491, and the second bonding layer 492. The first bonding layer 491 and the LED element 400 (reverse face electrode 43), and also the second bonding layer 492 and the conductive member (first obverse face portion 211) are conductively bonded to each other by metal solid-phase diffusion, and the metal base layer 490 is disposed between the first bonding layer 491 and the second bonding layer 492. With such a configuration, the metal base layer 490 serves as a cushion, when the first bonding layer 491 and the LED element 400 (reverse face electrode 43), and also the second bonding layer 492 and the conductive member 2 (first obverse face portion 211) are bonded to each other by solid-phase diffusion. Therefore, the pressure imposed on the interface between the first bonding layer 491 and the LED element 400 (reverse face electrode 43), and the interface between the second bonding layer 492 and the conductive member 2 (first obverse face portion 211), can be levelled off. Therefore, the first bonding layer 491 and the LED element 400 (reverse face electrode 43), and also the second bonding layer 492 and the conductive member 2 (first obverse face portion 211), can be firmly bonded to each other, by solid-phase diffusion bonding. As result, the bonding status provided by the conductive bonding material 49 can be prevented from changing, despite the conductive bonding material 49 being repeatedly exposed to a high temperature, owing to the heat generated in the LED element 400, when the semiconductor device A30 is in use. Consequently, the semiconductor device A30 including the conductive bonding material 49 improves the reliability in terms of the bonding status between the LED element 400 and the conductive member 2.

In this embodiment, the Young's modulus of the metal base layer 490 is smaller than that of the material of each of the first bonding layer 491 and the second bonding layer 492. Accordingly, when the conductive bonding material 49 is bonded to the LED element 400 (reverse face electrode 43) and the conductive member 2 (first obverse face portion 211) by solid-phase diffusion, the stress is mitigated by the metal base layer 490, which is relatively softer, and therefore the bonding interface can be smoothed. As result, the first bonding layer 491 and the LED element 400 (reverse face electrode 43), and the second bonding layer 492 and the conductive member 2 (first obverse face portion 211), can be bonded with increased strength, by solid-phase diffusion.

In this embodiment, the metal base layer 490 is thicker than the first bonding layer 491 and the second bonding layer 492. Accordingly, when the solid-phase diffusion bonding is performed, the pressure imposed on the interface between the first bonding layer 491 and the LED element 400 (reverse face electrode 43), and the interface between the second bonding layer 492 and the conductive member 2 (first obverse face portion 211) can be more effectively levelled off. Consequently, the first bonding layer 491 and the LED element 400 (reverse face electrode 43), and the second bonding layer 492 and the conductive member 2

(first obverse face portion 211), can be conductively bonded to each other, with further increased bonding strength.

The conductive bonding material 49 includes the first intermediate layer 493 and the second intermediate layer 494. The first intermediate layer 493 is disposed between the metal base layer 490 and the first bonding layer 491, and the second intermediate layer 494 is disposed between the metal base layer 490 and the second bonding layer 492. The presence of the first intermediate layer 493 and the second intermediate layer 494 is advantageous in levelling off the pressure imposed on the interface between the first bonding layer 491 and the LED element 400 (reverse face electrode 43), and the interface between the second bonding layer 492 and the conductive member 2 (first obverse face portion 211), when the solid-phase diffusion bonding is performed. In addition, since the first intermediate layer 493 and the second intermediate layer 494 are each formed of nickel, the Young's modulus of the first intermediate layer 493 and the second intermediate layer 494 is relatively large. In this case, the pressure imposed on the bonding interface, during the solid-phase diffusion bonding process, can be made more even, and consequently the first bonding layer 491 and the LED element 400 (reverse face electrode 43), and the second bonding layer 492 and the conductive member 2 (first obverse face portion 211), can be conductively bonded to each other, with further increased bonding strength.

In this embodiment, the first bonding layer 491 and the second bonding layer 492 each contain silver. With such a configuration, the first bonding layer 491 and the second bonding layer 492 are prevented from being oxidized when the solid-phase diffusion bonding is performed using the conductive bonding material 49, and therefore the quality of the solid-phase diffusion bonding can be improved.

The specific embodiments of the present disclosure have been described as above. However, the present disclosure is in no way limited to those embodiments, but various modifications may be made. The specific configurations of the semiconductor device according to the present disclosure may be designed in various different manners.

The material and thickness of each of the layers constituting the conductive bonding material according to the present disclosure is not limited to the foregoing embodiments either. Although the conductive bonding material includes the metal base layer, the first bonding layer, the second bonding layer, the first intermediate layer, and the second intermediate layer in the foregoing embodiments, for example the first intermediate layer and the second intermediate layer may be excluded. Regarding the conductive bonding material, a different metal layer may be interposed, for example, between the metal base layer and the first bonding layer, or between the metal base layer and the second bonding layer 492, in addition to forming the metal base layer, the first bonding layer, the second bonding layer, the first intermediate layer, and the second intermediate layer.

The present disclosure encompasses the configurations according to the following Clauses.

Clause 1.
 A semiconductor device including:
 a conductive member having an obverse face;
 a semiconductor element mounted on the obverse face; and
 a conductive bonding material disposed between the conductive member and the semiconductor element to conductively bond the conductive member and the semiconductor element together,
 in which the conductive bonding material includes a metal base layer, a first bonding layer, and a second bonding layer,
 the first bonding layer is disposed between the metal base layer and the semiconductor element, and bonded to the semiconductor element by metal solid-phase diffusion, and
 the second bonding layer is disposed between the metal base layer and the conductive member, and bonded to the conductive member by metal solid-phase diffusion.

Clause 2.
 The semiconductor device according to Clause 1,
 in which a Young's modulus of the metal base layer is smaller than a Young's modulus of each of the first bonding layer and the second bonding layer.

Clause 3.
 The semiconductor device according to Clause 2,
 in which the metal base layer is thicker than each of the first bonding layer and the second bonding layer.

Clause 4.
 The semiconductor device according to Clause 3,
 in which a material of the metal base layer includes at least one of aluminum, titanium, zinc, hafnium, and erbium.

Clause 5.
 The semiconductor device according to Clause 4,
 in which a material of each of the first bonding layer and the second bonding layer includes at least one of silver, copper, and gold.

Clause 6.
 The semiconductor device according to any one of clauses 1 to 5,
 in which the semiconductor element includes an element main body, and a reverse face electrode formed on the element main body, and
 the reverse face electrode and the first bonding layer are bonded to each other by solid-phase diffusion.

Clause 7.
 The semiconductor device according to Clause 6,
 in which the first bonding layer and the second bonding layer are each thicker than the reverse face electrode.

Clause 8.
 The semiconductor device according to any one of clauses 1 to 7,
 in which the conductive bonding material includes a first intermediate layer and a second intermediate layer, the first intermediate layer is disposed between the metal base layer and the first bonding layer, and the second intermediate layer is disposed between the metal base layer and the second bonding layer.

Clause 9.
 The semiconductor device according to Clause 8,
 in which a material of each the first intermediate layer and the second intermediate layer includes nickel.

Clause 10.
 The semiconductor device according to any one of clauses 1 to 9, further including a support substrate including a support face opposed to the conductive member.

Clause 11.
 The semiconductor device according to Clause 10, further including a bonding material that bonds the conductive member to the support substrate,
 in which the bonding material includes a plurality of metal layers bonded to each other by solid-phase diffusion.

Clause 12.

The semiconductor device according to Clause 10 or 11, further including a sealing resin covering the conductive member, the semiconductor element, and a part of the support substrate, in which the support substrate includes a bottom face on an opposite side of the support face, and the bottom face is exposed from the sealing resin.

Clause 13.

The semiconductor device according to Clause 12, further including a first input terminal, a second input terminal, a first output terminal, and a second output terminal, in which the semiconductor element includes a first switching element and a second switching element, the conductive member includes a first conductive member to which the first switching element is conductively bonded, and a second conductive member to which the second switching element is conductively bonded, the first input terminal is connected to the first conductive member, the second input terminal is connected to the second switching element, and the first output terminal and the second output terminal are connected to the second conductive member, and the sealing resin covers a part of each of the first input terminal, the second input terminal, the first output terminal, and the second output terminal.

Clause 14.

The semiconductor device according to any one of clauses 1 to 9, further including a base member including a support face that supports the semiconductor element, in which the conductive member includes an obverse face portion, a reverse face portion, and a connecting portion electrically connecting the obverse face portion and the reverse face portion.

Clause 15.

The semiconductor device according to Clause 14, in which the semiconductor element includes a semiconductor laser element and a switching element, the conductive member includes a first section and a second section spaced apart from each other, and the semiconductor laser element is conductively bonded to the first section, and the switching element is conductively bonded to the second section.

Clause 16.

The semiconductor device according to Clause 15, further including a light-transmitting resin covering the semiconductor laser element, the switching element, and the support face of the base member.

Clause 17.

The semiconductor device according to Clause 14, further including a light-transmitting resin, in which the semiconductor element includes an LED element, and the light-transmitting resin covers the LED element, and at least a part of the support face of the base member.

Clause 18.

The semiconductor device according to Clause 17, further including a frame-shaped barrier portion located on the support face of the base member, in which the barrier portion surrounds the light-transmitting resin, as viewed in a thickness direction of the base member.

REFERENCE SIGNS

A10, A20, A30 semiconductor device
1 base member
1A support face
1B bottom face
10 support substrate
10A support face
10B bottom face
11 first support plate
12 second support plate
121 first region
122 second region
123 third region
13 bottom plate
13A recess
14 first face
15 second face
16 third face
17 fourth face
18 barrier portion
19 bonding material
2 conductive member
20 conductive member
20A obverse face
20B reverse face
201 first conductive member
202 second conductive member
203 third conductive member
21 obverse face portion
21A obverse face
211 first obverse face portion
211A obverse face
211B protruding portion
212 second obverse face portion
212A obverse face
212B recess
213 third obverse face portion
213A obverse face
214 fourth obverse face portion
214A obverse face
22 reverse face portion
221 first reverse face portion
222 second reverse face portion
223 third reverse face portion
224 fourth reverse face portion
23 connecting portion
231 first connecting portion
232 second connecting portion
233 third connecting portion
234 fourth connecting portion
24 base material
25 conductor layer
26 insulation layer
271 gate wiring layer
272 detection wiring layer
31 first input terminal
311 bent portion
32 second input terminal
321 bent portion
33 first output terminal
331 bent portion
34 second output terminal
341 bent portion
35 gate terminal
36 detection terminal
4 semiconductor laser element
40 semiconductor element
400 LED element
401 first element
402 second element 41 element main body
411 element obverse face
412 element reverse face
42 obverse face electrode
421 electrode pad
43 reverse face electrode
44 first laser electrode
45 second laser electrode (reverse face electrode)
49 conductive bonding material
490 metal base layer
491 first bonding layer
492 second bonding layer
493 first intermediate layer
494 second intermediate layer
495 void
5 switching element
51 element main body
511 element obverse face
512 element reverse face
52 gate electrode
53 source electrode
54 drain electrode (reverse face electrode)
59 conductive bonding material
6 capacitor
61 electrode
62 electrode
7 wire
71 first wire
72 second wire
73 third wire
8 light-transmitting resin
80 encapsulating resin
81 resin obverse face
82 resin bottom face
84 resin first face
85 resin second face
86 resin third face
87 resin fourth face
9 pressing member
L laser beam
x direction
y direction
z direction (thickness direction)

The invention claimed is:

1. A semiconductor device comprising:
a conductive member having an obverse face;
a semiconductor element mounted on the obverse face; and
a conductive bonding material disposed between the conductive member and the semiconductor element to conductively bond the conductive member and the semiconductor element together,
wherein the conductive bonding material includes a metal base layer, a first bonding layer, and a second bonding layer,
the first bonding layer is disposed between the metal base layer and the semiconductor element, and bonded to the semiconductor element by metal solid-phase diffusion,
the second bonding layer is disposed between the metal base layer and the conductive member, and bonded to the conductive member by metal solid-phase diffusion,
the first bonding layer includes a recessed portion overlapping with the semiconductor element as viewed in a thickness direction perpendicular to the obverse face, and the semiconductor element is received in the recessed portion,
the metal base layer includes a first portion and a second portion continuous with the first portion, the first portion being spaced apart from the semiconductor element as viewed in the thickness direction, the second portion overlapping with the semiconductor element as viewed in the thickness direction, the first portion being greater in thickness than the second portion, and
the conductive bonding material includes a first intermediate layer and a second intermediate layer, the first intermediate layer being disposed between the metal base layer and the first bonding layer, and the second intermediate layer being disposed between the metal base layer and the second bonding layer, the first intermediate layer and the second intermediate layer each being smaller in thickness than the first bonding layer and the second bonding layer.

2. The semiconductor device according to claim 1, wherein a Young's modulus of the metal base layer is smaller than a Young's modulus of each of the first bonding layer and the second bonding layer.

3. The semiconductor device according to claim 2, wherein the metal base layer is thicker than each of the first bonding layer and the second bonding layer.

4. The semiconductor device according to claim 3, wherein a material of the metal base layer includes at least one of aluminum, titanium, zinc, hafnium, and erbium.

5. The semiconductor device according to claim 4, wherein a material of each of the first bonding layer and the second bonding layer includes at least one of silver, copper, and gold.

6. The semiconductor device according to claim 1, wherein the semiconductor element includes an element main body, and a reverse face electrode formed on the element main body, and
the reverse face electrode and the first bonding layer are bonded to each other by solid-phase diffusion.

7. The semiconductor device according to claim 6, wherein the first bonding layer and the second bonding layer are each thicker than the reverse face electrode.

8. The semiconductor device according to claim 1, wherein a material of each the first intermediate layer and the second intermediate layer includes nickel.

9. The semiconductor device according to claim 1, further comprising a support substrate including a support face opposed to the conductive member.

10. The semiconductor device according to claim 9, further comprising a bonding material that bonds the conductive member to the support substrate,
wherein the bonding material includes a plurality of metal layers bonded to each other by solid-phase diffusion.

11. The semiconductor device according to claim 9, further comprising a sealing resin covering the conductive member, the semiconductor element, and a part of the support substrate,
wherein the support substrate includes a bottom face on an opposite side of the support face, and the bottom face is exposed from the sealing resin.

12. The semiconductor device according to claim 11, further comprising a first input terminal, a second input terminal, a first output terminal, and a second output terminal,
wherein the semiconductor element includes a first switching element and a second switching element, the conductive member includes a first conductive member to which the first switching element is conductively bonded, and a second conductive member to which the second switching element is conductively bonded, the first input terminal is connected to the first conductive member, the second input terminal is connected to the second switching element, and the first output terminal and the second output terminal are connected to the second conductive member, and the sealing resin covers a part of each of the first input terminal, the second input terminal, the first output terminal, and the second output terminal.

13. The semiconductor device according to claim 1, further comprising a base member including a support face that supports the semiconductor element, wherein the conductive member includes an obverse face portion, a reverse face portion, and a connecting portion electrically connecting the obverse face portion and the reverse face portion.

14. The semiconductor device according to claim 13, wherein the semiconductor element includes a semiconductor laser element and a switching element, the conductive member includes a first section and a second section spaced apart from each other, and the semiconductor laser element is conductively bonded to the first section, and the switching element is conductively bonded to the second section.

15. The semiconductor device according to claim 14, further comprising a light-transmitting resin covering the semiconductor laser element, the switching element, and the support face of the base member.

16. The semiconductor device according to claim 13, further comprising a light-transmitting resin, wherein the semiconductor element includes an LED element, and the light-transmitting resin covers the LED element, and at least a part of the support face of the base member.

17. The semiconductor device according to claim 16, further comprising a frame-shaped barrier portion located on the support face of the base member, wherein the barrier portion surrounds the light-transmitting resin, as viewed in a thickness direction of the base member.

18. The semiconductor device according to claim 1, wherein the first bonding layer includes an outer portion, an inner portion, and a connecting portion disposed between the outer portion and the inner portion, the outer portion being spaced apart from the semiconductor element as viewed in the thickness direction, the inner portion overlapping with the semiconductor element as viewed in the thickness direction, wherein the outer portion and the inner portion are greater in thickness than the connecting portion.

19. The semiconductor device according to claim 1, wherein the semiconductor element has a height that is greater than a depth of the recessed portion.

20. The semiconductor device according to claim 1, wherein the first bonding layer includes an outer portion, an inner portion, and a connecting portion disposed between the outer portion and the inner portion, the outer portion being spaced apart from the semiconductor element as viewed in the thickness direction, the inner portion overlapping with the semiconductor element as viewed in the thickness direction, and voids are formed in an interface between the first bonding layer and the semiconductor element or in an interface between the second bonding layer and the conductive member in the connecting portion as viewed in the thickness direction.

* * * * *